(12) United States Patent
Lee et al.

(10) Patent No.: US 11,908,406 B2
(45) Date of Patent: Feb. 20, 2024

(54) ORGANIC LIGHT EMITTING DIODE DISPLAY DEVICE AND METHOD OF DRIVING THE SAME

(71) Applicant: LG Display Co., Ltd., Seoul (KR)

(72) Inventors: Boo-Heung Lee, Paju-si (KR); Yong-Min Jeong, Paju-si (KR); So-Yi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/971,420

(22) Filed: Oct. 21, 2022

(65) Prior Publication Data
US 2023/0206840 A1 Jun. 29, 2023

(30) Foreign Application Priority Data
Dec. 23, 2021 (KR) .......................... 10-2021-0185661

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2320/0209* (2013.01)

(58) Field of Classification Search
CPC ............................ G09G 3/3233; H10K 59/131
See application file for complete search history.

(56) References Cited

U.S. PATENT DOCUMENTS

| | | | |
|---|---|---|---|
| 10,541,286 B2 | 1/2020 | Park et al. | |
| 10,672,338 B2 | 6/2020 | Lin et al. | |
| 10,878,751 B2 | 12/2020 | Lin et al. | |
| 11,107,409 B2* | 8/2021 | Yang | G09G 3/3275 |
| 11,211,020 B2* | 12/2021 | Ono | G09G 3/3291 |
| 2018/0083078 A1 | 3/2018 | Park et al. | |
| 2018/0277037 A1 | 9/2018 | Lin et al. | |
| 2018/0342217 A1* | 11/2018 | Kim | G09G 3/3688 |
| 2019/0088207 A1 | 3/2019 | Lin et al. | |
| 2020/0312234 A1 | 10/2020 | Lin et al. | |

FOREIGN PATENT DOCUMENTS

| | | |
|---|---|---|
| CN | 210667751 U | 6/2020 |
| JP | 2020-509419 A | 3/2020 |
| KR | 10-2018-0032739 A | 4/2018 |
| KR | 10-2021-0085504 A | 7/2021 |

OTHER PUBLICATIONS

The Japan Patent Office, Office Action, Japanese Patent Application No. 2022-171876, dated Nov. 21, 2023, 12 pages.

* cited by examiner

*Primary Examiner* — Sardis F Azongha
(74) *Attorney, Agent, or Firm* — Fenwick & West LLP

(57) ABSTRACT

An organic light emitting diode display device includes: a plurality of pixels arranged in a matrix of a plurality of rows and a plurality of columns; a plurality of gate1 lines contacting and supplying a gate1 voltage to the plurality of pixels; a plurality of gate2 lines contacting and supplying a gate2 voltage to the plurality of pixels of a portion of the plurality of columns; a plurality of gate3 lines contacting and supplying a gate3 voltage to the plurality of pixels of another portion of the plurality of columns; and a plurality of left data lines and a plurality of right data lines at both sides, respectively, of the plurality of pixels of the plurality of columns.

12 Claims, 14 Drawing Sheets

ORGANIC LIGHT EMITTING DIODE DISPLAY DEVICE AND METHOD OF DRIVING THE SAME

CROSS REFERENCE TO RELATED APPLICATIONS

The present application claims the priority benefit of Republic of Korea Patent Application No. 10-2021-0185661 filed in Republic of Korea on Dec. 23, 2021, which is hereby incorporated by reference herein in its entirety.

BACKGROUND

Technical Field

The present disclosure relates to an organic light emitting diode display device, and more particularly, to an organic light emitting diode display device including a low level line where a coupling between a gate electrode and an anode is minimized by disposing the low level line between the gate electrode and the anode of each subpixel.

Discussion of the Related Art

According to an information-oriented society, a display device field has been rapidly progressed. A flat panel display (FPD) device having a thin profile, a light weight and a low power consumption has been developed.

Among the various flat panel display devices, an organic light emitting diode (OLED) display device is an emissive type device and does not include a backlight unit used in a non-emissive type device such as a liquid crystal display (LCD) device. As a result, the OLED display device has advantages in a viewing angle, a contrast ratio and a power consumption to be applied to various fields.

In the OLED display device, a data voltage outputted from a data driving unit is supplied to a pixel of a display panel to display an image. Since an application time of the data voltage to the pixel is reduced according to an increase of a resolution and a driving speed, a charging time to a data line is reduced.

To solve the above problem, an OLED display device where the data voltage is supplied to a single pixel column using two mux transistors and two data lines has been suggested.

In the OLED display device using the two mux transistors and the two data lines, since two adjacent pixel rows are driven to overlap by one horizontal period, a single data line is floated for one horizontal period and the data voltage of the floated data line is distorted due to a variation (ripple) of a high level voltage generated according to a transition of the data voltage of another data line. As a result, deterioration such as a crosstalk occurs.

SUMMARY

Accordingly, the present disclosure is directed to an organic light emitting diode display device and a method of driving the organic light emitting diode display device that substantially obviate one or more of the problems due to limitations and disadvantages of the related art.

An object of the present disclosure is to provide an organic light emitting diode display device where a number of pixel columns corresponding to a floated data line is reduced, a distortion of a data line due to a variation (ripple) of a high level voltage is reduced and a crosstalk is reduced by dividing a plurality of pixel columns into odd and even groups and assigning different sampling periods to the plurality of pixel columns of the odd and even groups and a method of driving the organic light emitting diode display device.

Another object of the present disclosure is to provide an organic light emitting diode display device where an operation of a pixel column corresponding to a common block is stabilized, a number of pixel columns corresponding to a floated data line is reduced, a distortion of a data line due to a variation (ripple) of a high level voltage is reduced and a crosstalk is reduced by disposing one common block to two pixels, dividing a plurality of pixel columns into odd and even groups and assigning different sampling periods to the plurality of pixel columns of the odd and even groups and a method of driving the organic light emitting diode display device.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes: a plurality of pixels arranged in a matrix of a plurality of rows and a plurality of columns; a plurality of gate1 lines contacting and supplying a gate1 voltage to the plurality of pixels; a plurality of gate2 lines contacting and supplying a gate2 voltage to the plurality of pixels of a portion of the plurality of columns; a plurality of gate3 lines contacting and supplying a gate3 voltage to the plurality of pixels of another portion of the plurality of columns; and a plurality of left data lines and a plurality of right data lines at both sides, respectively, of the plurality of pixels of the plurality of columns.

In another aspect, a method of driving an organic light emitting diode display device includes: initializing a plurality of pixels of a plurality of rows according to a gate1 voltage; sampling the plurality of pixels of a portion of a plurality of columns according to a gate2 voltage; sampling the plurality of pixels of another portion of the plurality of columns according to a gate3 voltage; and emitting light from the plurality of pixels according to an emission voltage.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
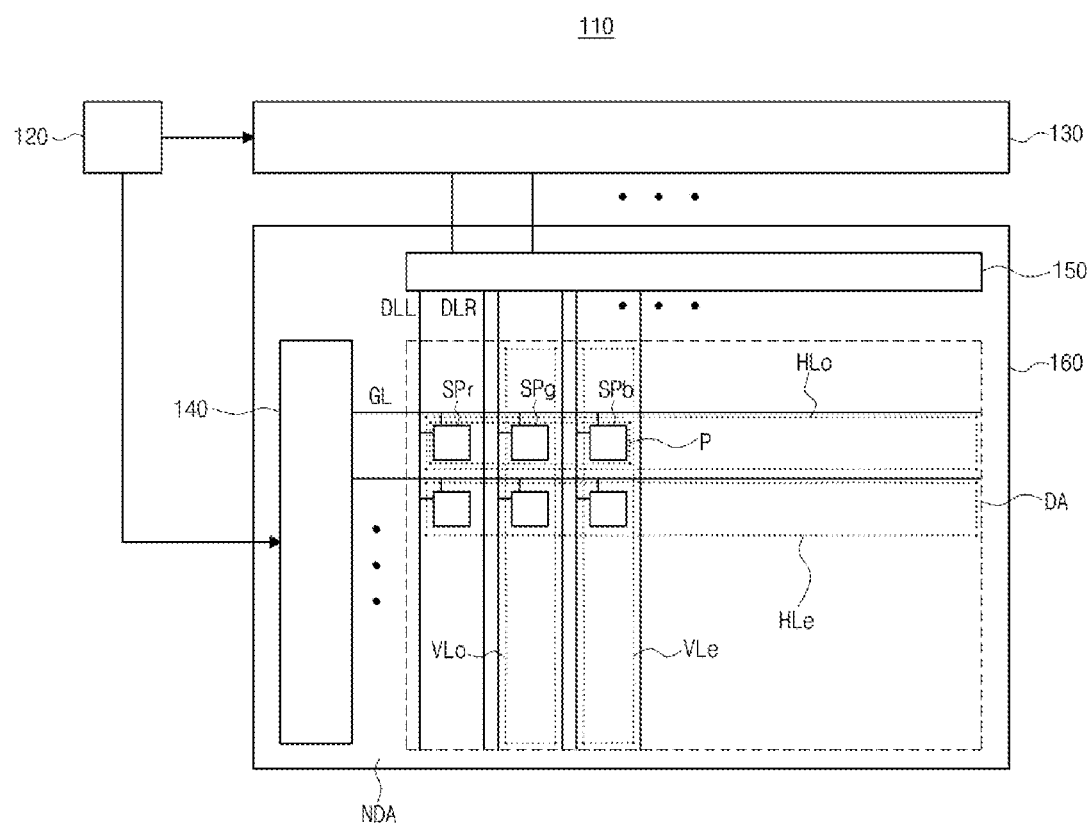
FIG. 1 is a view showing an organic light emitting diode display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an organic light emitting diode display device and a method of driving the organic light emitting diode display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

FIG. 1 is a view showing an organic light emitting diode display device according to a first embodiment of the present disclosure.

In FIG. 1, an organic light emitting diode (OLED) display device 110 according to a first embodiment of the present disclosure includes a timing controlling unit 120, a data driving unit 130, a gate driving unit 140, a mux unit 150 and a display panel 160.

The timing controlling unit 120 generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 130, and the gate control signal is transmitted to the gate driving unit 140.

The data driving unit 130 generates a data voltage (data signal) using the data control signal and the image data transmitted from the timing controlling unit 120 and transmits the data voltage to the mux unit 150.

The gate driving unit 140 generates a gate voltage (gate signal) using the gate control signal transmitted from the timing controlling unit 120 and applies the gate voltage to a gate line GL of the display panel 160.

The gate driving unit 140 may have a gate in panel (GIP) type to be formed in the display panel 160 with the gate line GL, left and right data lines DLL and DLR and a pixel P.

The mux unit 150 selectively applies the data voltage of the data driving unit 120 to one of the left and right data lines DLL and DLR of the display panel 160.

The mux unit 150 is disposed to correspond to a short side of the display panel 160 and is connected to the left and right data lines DLL and DLR. The mux unit 150 may include first and second mux transistors Tm1 and Tm2 (of FIG. 2).

The display panel 160 displays an image using the gate voltage and the data voltage. The display panel 160 includes a display area DA displaying the image and a non-display area NDA surrounding the display area DA. A plurality of pixels P, a plurality of gate lines GL, a plurality of left data lines DLL and a plurality of right data lines DLR are disposed in the display area DA, and the gate driving unit 140 and the mux unit 150 are disposed in the non-display area NDA.

Each of the plurality of pixel P includes a plurality of subpixels SP. For example, the plurality of subpixels SP may include red, green and blue subpixels SPr, SPg and SPb.

The gate line GL crosses the left data line DLL and the right data line DLR to define the subpixel SP.

The left and right data lines DLL and DLR are disposed at left and right of each subpixel SP, and each subpixel SP is connected to one of the left and right data lines DLL and DLR.

For example, the subpixel SP of an odd row (odd horizontal pixel line) HL-o may be connected to the gate line GL and the left data line DLL, and the subpixel SP of an even row HL-e may be connected to the gate line GL and the right data line DLR.

The mux unit of the OLED display device 110 will be illustrated with reference to drawings.

Figure 2:
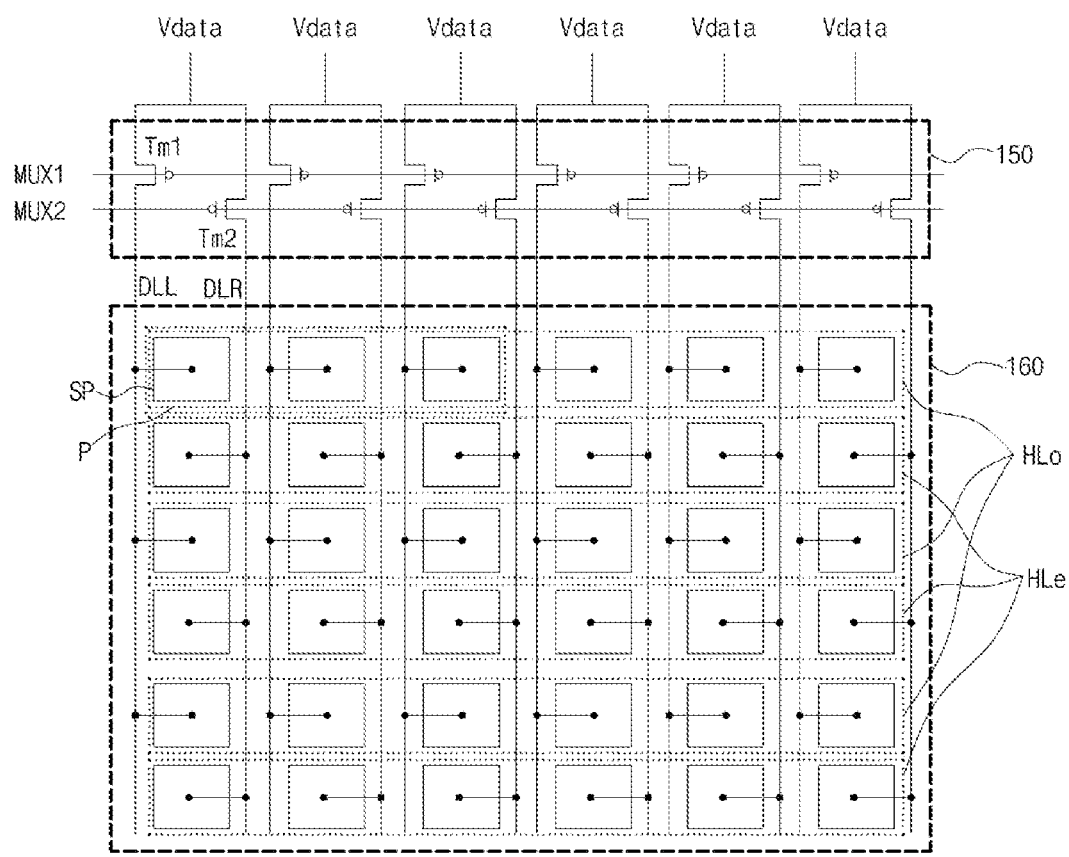
FIG. 2 is a view showing a mux unit and a display panel of an organic light emitting diode display device according to a first embodiment of the present disclosure.

FIG. 2 is a view showing a mux unit and a display panel of an organic light emitting diode display device according to a first embodiment of the present disclosure.

In FIG. 2, the mux unit 150 of the OLED display device 110 according to a first embodiment of the present disclosure includes first and second mux transistors Tm1 and Tm2. The first and second mux transistors Tm1 and Tm2 may have a positive (P) type.

The first mux transistor Tm1 is switched (turned on and turned off) according to a first mux voltage MUX1 to transmit the data voltage Vdata of the data driving unit 130 to the left data line DLL of the display panel 160, and the second mux transistor Tm2 is switched according to a second mux voltage MUX2 to transmit the data voltage Vdata of the data driving unit 130 to the right data line DLR of the display panel 160.

For example, the first and second mux voltages MUX1 and MUX2 may include a square wave having an opposite polarity and a width of one horizontal period (1H).

During one horizontal period where the first mux transistor Tm1 is turned on and the second mux transistor Tm2 is turned off, the data voltage Vdata of the data driving unit 130 is supplied to the subpixel SP of the odd row HL-o through the left data line DLL of the display panel 160 by the mux unit 150.

During one horizontal period where the first mux transistor Tm1 is turned off and the second mux transistor Tm2 is turned on, the data voltage Vdata of the data driving unit 130 is supplied to the subpixel SP of the even row HL-e through the right data line DLR of the display panel 160 by the mux unit 150.

The data voltage Vdata is supplied to the left data line DLL during one horizontal period, and the data voltage Vdata is maintained in the floated left data line DLL during the next horizontal period where the data voltage Vdata is supplied to the subpixel SP of the even row HL-e through the right data line DLR. As a result, an application time for each subpixel SP increases to two horizontal periods and a charging time of the data voltage Vdata increases.

An operation of the pixel P of the OLED display device 110 will be illustrated with reference to drawings.

Figure 3:
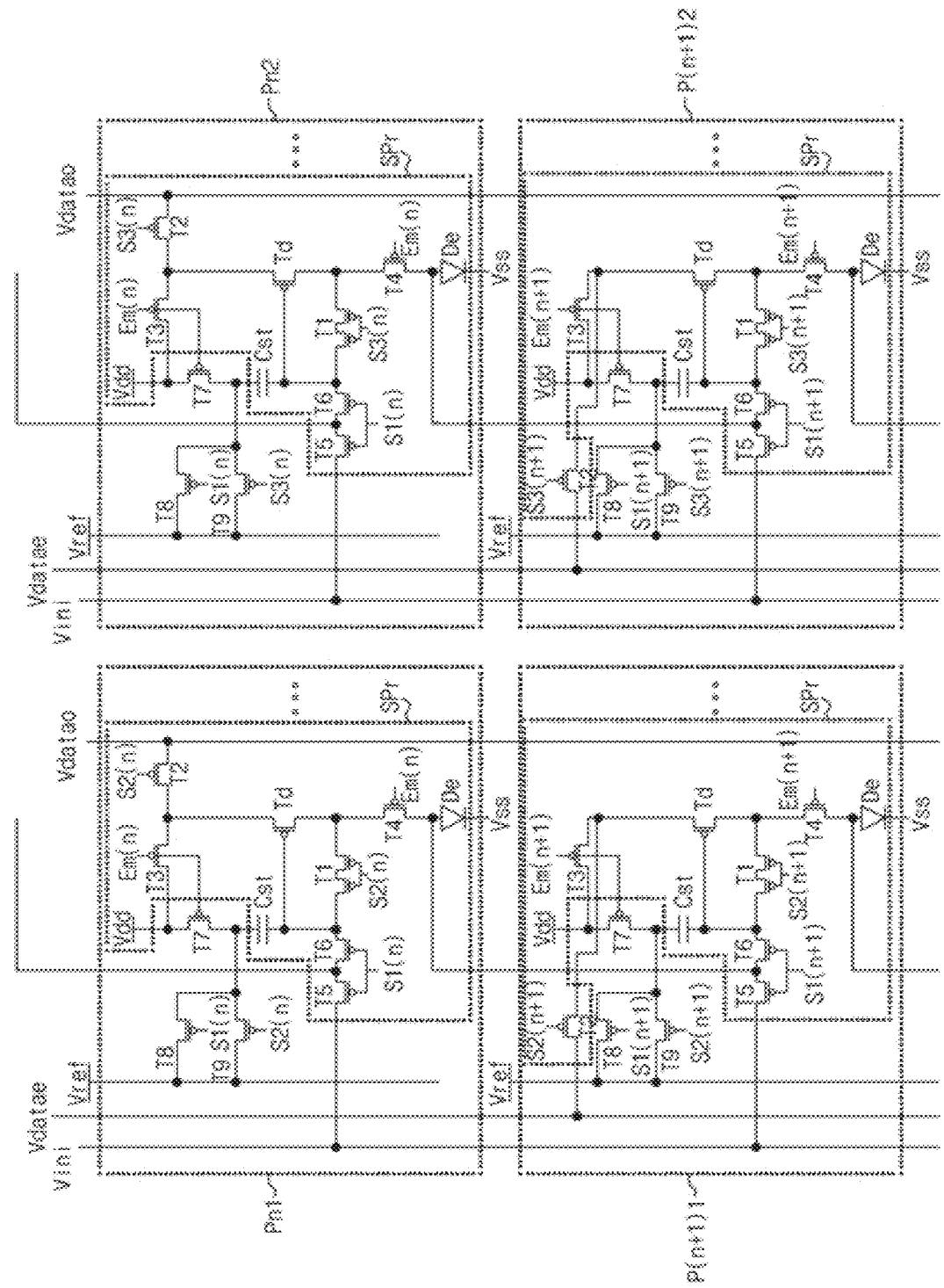
FIG. 3 is a circuit diagram showing a subpixel of an organic light emitting diode display device according to a first embodiment of the present disclosure.
Figure 4:
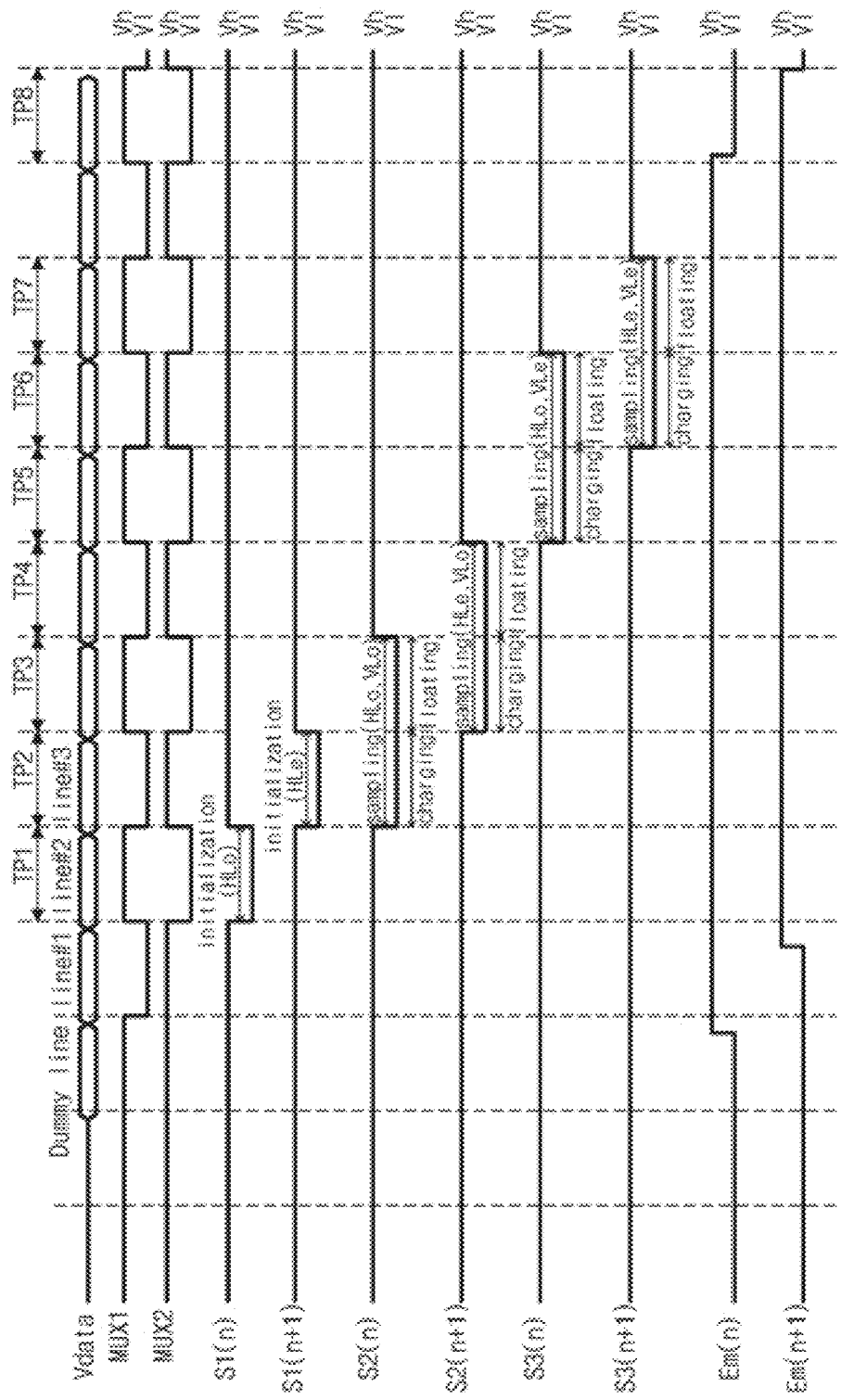
FIG. 4 is a view showing a plurality of signals used in a subpixel of an organic light emitting diode display device according to a first embodiment of the present disclosure.

FIG. 3 is a circuit diagram showing a subpixel of an organic light emitting diode display device according to a first embodiment of the present disclosure, and FIG. 4 is a view showing a plurality of signals used in a subpixel of an organic light emitting diode display device according to a first embodiment of the present disclosure.

In FIG. 3, the plurality of pixels P of the display panel 160 (of FIG. 2) include an nth-first pixel Pn1 in a nth row and a first column, an nth-second pixel Pn2 in an nth row and a second column, an (n+1)th-first pixel P(n+1)1 in an (n+1)th row and a first column and an (n+1)th-second pixel P(n+1)2 in an (n+1)th row and a second column, and each of the nth-first pixel Pn1, the nth-second pixel Pn2, the (n+1)th-first pixel P(n+1)1 and the (n+1)th-second pixel P(n+1)2 includes red, green and blue subpixels SPr, SPg and SPb. Here, n may be an odd number and (n+1) may be an even number.

Each of the red, green and blue subpixels SPr, SPg and SPb includes a driving transistor Td, first to sixth transistors T1 to T6, a storage capacitor Cst and a light emitting diode De, and the red, green and blue subpixels SPr, SPg and SPb include seventh to ninth transistors T7 to T9.

The driving transistor Td, the first to sixth transistors T1 to T6, the storage capacitor Cst and the light emitting diode De are disposed in each of the red, green and blue subpixels SPr, SPg and SPb, and the seventh to ninth transistors T7 to T9 are disposed in one pixel P constituted by the red, green and blue subpixels SPr, SPg and SPb.

For example, the driving transistor Td and the first to ninth transistors T1 to T9 may include a polycrystalline silicon thin film transistor of a positive (P) type.

In the red subpixel SPr of the nth-first pixel Pn1, the driving transistor Td is switched according to a voltage of a first electrode of the storage capacitor Cst. A gate electrode of the driving transistor Td is connected to the first electrode of the storage capacitor Cst, a drain electrode of the first transistor T1 and a source electrode of the sixth transistor T6, a source electrode of the driving transistor Td is connected to a drain electrode of the second transistor T2 and a source electrode of the third transistor T3, and a drain electrode of the driving transistor Td is connected to a source electrode of the first transistor T1 and a source electrode of the fourth transistor T4.

The first transistor T1 is switched according to an nth gate2 voltage S2($n$). A gate electrode of the first transistor T1 is connected to the nth gate2 voltage S2($n$), the source electrode of the first transistor T1 is connected to the drain electrode of the driving transistor Td and the source electrode of the fourth transistor T4, and the drain electrode of the first transistor T1 is connected to the gate electrode of the driving transistor Td, the first electrode of the storage capacitor Cst and the source electrode of the sixth transistor T6.

The second transistor T2 of a switching transistor is switched according to the nth gate2 voltage S2($n$). A gate electrode of the second transistor T2 is connected to the nth gate2 voltage S2($n$), a source electrode of the second transistor T2 is connected to an odd data voltage Vdatao, and the drain electrode of the second transistor T2 is connected to the source electrode of the driving transistor Td and the source electrode of the third transistor T3.

The third transistor T3 is switched according to an nth emission voltage Em(n). A gate electrode of the third transistor T3 is connected to the nth emission voltage Em(n), the source electrode of the third transistor T3 is connected to the drain electrode of the second transistor T3 and the source electrode of the driving transistor Td, and a drain electrode of the third transistor T3 is connected to a high level voltage Vdd and a source electrode of the seventh transistor T7.

The fourth transistor T4 of an emission transistor is switched according to the nth emission voltage Em(n). A gate electrode of the fourth transistor T4 is connected to the nth emission voltage Em(n), the source electrode of the fourth transistor T4 is connected to the drain electrode of the driving transistor Td and the source electrode of the first transistor T1, and a drain electrode of the fourth transistor T4 is connected to an anode of the light emitting diode De, a source electrode of a fifth transistor T5 of a red subpixel SPr of an (n+1)-first pixel P(n+1)1 of a next row and a drain electrode of the sixth transistor T6.

The fifth transistor T5 is switched according to an nth gate1 voltage S1($n$). A gate electrode of the fifth transistor T5 is connected to the nth gate1 voltage S1($n$), the source electrode of the fifth transistor T5 is connected to the drain electrode of the sixth transistor T6, a drain electrode of a fourth transistor T4 of a red subpixel SPr of an (n−1)-first pixel P(n−1)1 of a previous row and the anode of the light emitting diode De, and a drain electrode of the fifth transistor T5 is connected to an initial voltage Vini.

The sixth transistor T6 is switched according to an nth gate1 voltage S1($n$). A gate electrode of the sixth transistor T6 is connected to the nth gate1 voltage S1($n$), the source electrode of the sixth transistor T6 is connected to the gate electrode of the driving transistor Td, the first electrode of the storage capacitor Cst and the drain electrode of the first transistor T1, and the drain electrode of the sixth transistor T6 is connected to the source electrode of the fifth transistor T5, a drain electrode of a fourth transistor T4 of a red subpixel SPr of the (n−1)th-first pixel P(n−1)1 of a previous row and the anode of the light emitting diode De.

The storage capacitor Cst stores the odd data voltage Vdatao, a threshold voltage Vth and the high level voltage Vdd. The first electrode of the storage capacitor Cst is connected to the gate electrode of the driving transistor Td, the drain electrode of the first transistor T1 and the source electrode of the sixth transistor T6, and a second electrode of the storage capacitor Cst is connected to a drain electrode of the seventh transistor T7, a source electrode of the eighth transistor T8 and a source electrode of the ninth transistor T9.

The light emitting diode De is connected between the fourth transistor T4 and a low level voltage Vss and emits a light of a luminance proportional to a current of the driving transistor Td. The anode of the light emitting diode De is connected to the drain electrode of the fourth transistor T4, a source electrode of a fifth transistor T5 of the (n+1)th-first pixel P(n+1)1 and the drain electrode of the sixth transistor T6, and a cathode of the light emitting diode De is connected to the low level voltage Vss.

A connection structure of the driving transistor Td, the first to sixth transistors T1 to T6, the storage capacitor Cst and the light emitting diode De of the green and blue subpixels SPg and SPb of the nth-first pixel Pn1 is the same as the connection structure of the driving transistor Td, the first to sixth transistors T1 to T6, the storage capacitor Cst and the light emitting diode De of the red subpixel SPr of the nth-first pixel Pn1.

In the nth-first pixel Pn1, the seventh transistor T7 is switched according to the nth emission voltage Em(n). A gate electrode of the seventh transistor T7 is connected to the nth emission voltage Em(n), a source electrode of the seventh transistor T7 is connected to the high level voltage Vdd and the drain electrode of the third transistor T3 of the red, green and blue subpixels SPr, SPg and SPb, and the drain electrode of the seventh transistor T7 is connected to the source electrode of the eighth transistor T8, the source electrode of the ninth transistor T9 and the second electrode of the storage capacitor Cst of the red, green and blue subpixels SPr, SPg and SPb.

The eighth transistor T8 is switched according to the nth gate1 voltage S1($n$). A gate electrode of the eighth transistor T8 is connected to the nth gate1 voltage S1($n$), the source electrode of the eighth transistor T8 is connected to the source electrode of the ninth transistor T9, the drain electrode of the seventh transistor T7 and the second electrode of the storage capacitor Cst of the red, green and blue subpixels SPr, SPg and SPb, and a drain electrode of the eighth transistor T8 is connected to a reference voltage Vref.

The ninth transistor T9 is switched according to the nth gate2 voltage S2($n$). A gate electrode of the ninth transistor T9 is connected to the nth gate2 voltage S2($n$), the source electrode of the ninth transistor T9 is connected to the source electrode of the eighth transistor T8, the drain electrode of the seventh transistor T7 and the second electrode of the storage capacitor Cst of the red, green and blue subpixels SPr, SPg and SPb, and a drain electrode of the ninth transistor T9 is connected to the reference voltage Vref.

A connection structure of the driving transistor Td, the first to ninth transistors T1 to T9, the storage capacitor Cst and the light emitting diode De of the nth-second pixel Pn2 is the same as the connection structure of the driving transistor Td, the first to ninth transistors T1 to T9, the storage capacitor Cst and the light emitting diode De of the nth-first pixel Pn1 except that the gate electrodes of the first, second and ninth transistors T1, T2 and T9 are connected to an nth gate3 voltage S3($n$) and the first, second and ninth transistors T1, T2 and T9 are switched according to the nth gate3 voltage S3($n$).

A connection structure of the driving transistor Td, the first to ninth transistors T1 to T9, the storage capacitor Cst and the light emitting diode De of the nth-second pixel Pn2 is the same as the connection structure of the driving transistor Td, the first to ninth transistors T1 to T9, the storage capacitor Cst and the light emitting diode De of the nth-first pixel Pn1 except that the first to ninth transistors T1 to T9 are switched according to an (n+1)th voltages such as an (n+1)th gate1 voltage S1($n$+1), an (n+1)th gate2 voltage S2($n$+1) and an (n+1)th emission voltage Em(n+1) and the source electrode of the second transistor T2 is connected to an even data voltage Vdatae.

A structure of the driving transistor Td, the first to ninth transistors T1 to T9, the storage capacitor Cst and the light emitting diode De of the (n+1)th-second pixel P(n+1)2 is the same as the structure of the driving transistor Td, the first to ninth transistors T1 to T9, the storage capacitor Cst and the light emitting diode De of the (n+1)th-first pixel P(n+1)1 except that the gate electrodes of the first, second and ninth transistors T1, T2 and T9 are connected to an (n+1)th gate3 voltage S3($n$+1) and the first, second and ninth transistors T1, T2 and T9 are switched according to the (n+1)th gate3 voltage S3($n$+1).

Although not shown, a structure of the pixel P of an odd row HL and an odd column (vertical pixel line) VL is the same as the structure of the nth-first pixel Pn1, and a structure of the pixel P of an odd row HL and an even column VL is the same as a structure of the nth-second pixel Pn2. A structure of the pixel P of an even row HL and an odd column VL is the same as the structure of the (n+1)th-first pixel P(n+1)1, and a structure of the pixel P of an even row HL and an even column VL is the same as a structure of the (n+1)th-second pixel P(n+1)2.

In FIG. 4, a frame for displaying an image includes first to sixth time periods TP1 to TP6. Each of the first to sixth time periods TP1 to TP6 may be one horizontal period 1H where the data voltage Vdata is applied to one row HL of the display panel 160.

During the first time period TP1, the second mux voltage MUX2 and the nth gate1 voltage S1($n$) become a low level voltage V1, and the first mux voltage MUX1, the (n+1)th gate1 voltage S1($n$+1), the nth gate2 voltage S2($n$), the (n+1)th gate2 voltage S2($n$+1), the nth gate3 voltage S3($n$), the (n+1)th gate3 voltage S3(n+1), the nth emission voltage Em(n) and the (n+1)th emission voltage Em(n+1) become a high level voltage Vh. The second mux transistor Tm2 and the fifth, sixth and eighth transistors T5, T6 and T8 of the nth-first and nth-second pixels Pn1 and Pn2 are turned on, and the first mux transistor Tm1, the first, second, third, fourth, seventh and ninth transistors T1, T2, T3, T4, T7 and T9 of the nth-first and nth-second pixels Pn1 and Pn2 and the first to ninth transistors T1 to T9 of the (n+1)th-first and (n+1)th-second pixels P(n+1)1 and P(n+1)2 are turned off. The first and second electrodes of the storage capacitor Cst of the nth-first and nth-second pixels Pn1 and Pn2 become the initial voltage Vini and the reference voltage Vref, respectively, and the gate electrode of the driving transistor Td of the nth-first and nth-second pixels Pn1 and Pn2 is initialized.

During the second time period TP2, the first mux voltage MUX1 and the (n+1)th gate1 voltage S1(n+1) become a low level voltage V1, and the second mux voltage MUX2, the nth gate1 voltage S1(n), the (n+1)th gate2 voltage S2(n+1), the nth gate3 voltage S3(n), the (n+1)th gate3 voltage S3(n+1), the nth emission voltage Em(n) and the (n+1)th emission voltage Em(n+1) become a high level voltage Vh. The first mux transistor Tm1 and the first, second and ninth transistors T1, T2 and T9 of the nth-first pixels Pn1, and the fifth, sixth and eighth transistors T5, T6 and T8 of the (n+1)th-first and (n+1)th-second pixels P(n+1)1 and P(n+1)2 are turned on, and the second mux transistor Tm2, the third to eighth transistors T3 to T8 of the nth-first pixel Pn1, the first to ninth transistors T1 to T9 of the nth-second pixel Pn2, and the first, second, third, fourth, seventh and ninth transistors T1, T2, T3, T4, T7 and T9 of the (n+1)th-first and (n+1)th-second pixels P(n+1)1 and P(n+1)2 are turned off. The first electrode of the storage capacitor Cst of the nth-first and nth-second pixels Pn1 and Pn2 become a sum (Vdata+Vth) of the data voltage Vdata and the threshold voltage Vth, and the data voltage Vdata and the threshold voltage Vth are stored in the storage capacitor Cst. The first and second electrodes of the storage capacitor Cst of the (n+1)th-first and (n+1)th-second pixels P(n+1)1 and P(n+1)2 become the initial voltage Vini and the reference voltage Vref, respectively, and the gate electrode of the driving transistor Td of the nth-first and nth-second pixels Pn1 and Pn2 is initialized.

During the third time period TP3, the second mux voltage MUX2, the nth gate2 voltage S2(n) and the (n+1)th gate2 voltage S2(n+1) become a low level voltage V1, and the first mux voltage MUX1, the nth gate1 voltage S1(n), the (n+1)th gate1 voltage S1(n+1), the nth gate3 voltage S3(n), the (n+1)th gate3 voltage S3(n+1), the nth emission voltage Em(n) and the (n+1)th emission voltage Em(n+1) become a high level voltage Vh. The second mux transistor Tm2 and the first, second and ninth transistors T1, T2 and T9 of the nth-first and (n+1)th-first pixels Pn1 and P(n+1)1 are turned on, and the first mux transistor Tm1, the third to eighth transistors T3 and T8 of the nth-first and (n+1)th-first pixels Pn1 and P(n+1)1 and the first to ninth transistors T1 to T9 of the nth-second and (n+1)th-first pixels Pn2 and P(n+1)2 are turned off. The first electrodes of the storage capacitors Cst of the nth-first and (n+1)th-first pixels Pn1 and P(n+1)1 becomes a sum (Vdata+Vth) of the data voltage Vdata and the threshold voltage Vth, and the data voltage Vdata and the threshold voltage Vth are stored in the storage capacitor Cst.

During the fourth time period TP4, the first mux voltage MUX1 and the (n+1)th gate2 voltage S2(n+1) become a low level voltage V1, and the second mux voltage MUX2, the nth gate1 voltage S1(n), the (n+1)th gate1 voltage S1(n+1), the nth gate2 voltage S2(n), the nth gate3 voltage S3(n), the (n+1)th gate3 voltage S3(n+1), the nth emission voltage Em(n) and the (n+1)th emission voltage Em(n+1) become a high level voltage Vh. The first mux transistor Tm1 and the first, second and T9 of the (n+1)th-first pixel P(n+1)1 are turned on, and the second mux transistor Tm2, the first to ninth transistors T1 to T9 of the nth-first, nth-second and (n+1)th-second pixels Pn1, Pn2 and P(n+1)2, and the third to eighth transistors T3 to T8 of the (n+1)th-first pixel P(n+1)1 are turned off. The first electrode of the storage capacitor Cst of the (n+1)th-first pixel P(n+1)1 becomes a sum (Vdata+Vth) of the data voltage Vdata and the threshold voltage Vth, and the data voltage Vdata and the threshold voltage Vth are stored in the storage capacitor Cst.

During the fifth time period TP5, the second mux voltage MUX2 and the nth gate3 voltage S3(n) become a low level voltage V1, and the first mux voltage MUX1, the nth gate1 voltage S1(n), the (n+1)th gate1 voltage S1(n+1), the nth gate2 voltage S2(n), the (n+1)th gate2 voltage S2(n+1), the (n+1)th gate3 voltage S3(n+1), the nth emission voltage Em(n) and the (n+1)th emission voltage Em(n+1) become a high level voltage Vh. The second mux transistor Tm2 and the first, second and ninth transistors T1, T2 and T9 of the nth-second pixel Pn2 are turned on, and the first mux transistor Tm1, the first to ninth transistors T1 to T9 of the nth-first, (n+1)th-first and (n+1)th-second pixels Pn1, P(n+1)1 and P(n+1)2, and the third to eighth transistors T3 to T8 of the nth-second pixel Pn2 are turned off. The first electrode of the storage capacitor Cst of the nth-second pixel Pn2 becomes a sum (Vdata+Vth) of the data voltage Vdata and the threshold voltage Vth, and the data voltage Vdata and the threshold voltage Vth are stored in the storage capacitor Cst.

During the sixth time period TP6, the first mux voltage MUX1 and the nth gate3 voltage S3(n) become a low level voltage V1, and the second mux voltage MUX2, the nth gate1 voltage S1(n), the (n+1)th gate1 voltage S1(n+1), the nth gate2 voltage S2(n), the (n+1)th gate2 voltage S2(n+1), the nth emission voltage Em(n) and the (n+1)th emission voltage Em(n+1) become a high level voltage Vh. The first mux transistor Tm1 and the first, second and ninth transistors T1, T2 and T9 of the nth-second and (n+1)th-second pixels Pn2 and P(n+1)2 are turned on, and the second mux transistor Tm2, the first to ninth transistors T1 to T9 of the nth-first and (n+1)th-first pixels Pn1 and P(n+1)1, and the third to eighth transistors T3 to T8 of the nth-second and (n+1)th-second pixels Pn2 and P(n+1)2 are turned off. The first electrodes of the storage capacitors Cst of the nth-second and (n+1)th-second pixels Pn2 and P(n+1)2 become a sum (Vdata+Vth) of the data voltage Vdata and the threshold voltage Vth, and the data voltage Vdata and the threshold voltage Vth are stored in the storage capacitor Cst.

During the seventh time period TP7, the second mux voltage MUX2 and the (n+1)th gate3 voltage S3(n+1) become a low level voltage V1, and the first mux voltage MUX1, the nth gate1 voltage S1(n), the (n+1)th gate1 voltage S1(n+1), the nth gate2 voltage S2(n), the (n+1)th gate2 voltage S2(n+1), the nth gate3 voltage S3(n), the nth emission voltage Em(n) and the (n+1)th emission voltage Em(n+1) become a high level voltage Vh. The second mux transistor Tm2 and the first, second and ninth transistors T1, T2 and T9 of the (n+1)th-second pixels P(n+1)2 are turned on, and the first mux transistor Tm1, the first to ninth transistors T1 to T9 of the nth-first, nth-second and (n+1)th-first pixels Pn1, Pn2 and P(n+1)1, and the third to eighth transistors T3 to T8 of the (n+1)th-second pixel P(n+1)2 are turned off. The first electrode of the storage capacitor Cst of the (n+1)th-second pixel P(n+1)2 become a sum (Vdata+

Vth) of the data voltage Vdata and the threshold voltage Vth, and the data voltage Vdata and the threshold voltage Vth are stored in the storage capacitor Cst.

During the eighth time period TP8, the second mux voltage MUX2 and the nth emission voltage Em(n) become a low level voltage Vl, and the first mux voltage MUX1, the nth gate1 voltage S1(n), the (n+1)th gate1 voltage S1(n+1), the nth gate2 voltage S2(n), the (n+1)th gate2 voltage S2(n+1), the nth gate3 voltage S3(n), the (n+1)th gate3 voltage S3(n+1) and the (n+1)th emission voltage Em(n+1) become a high level voltage Vh. The second mux transistor Tm2 and the third, fourth and seventh transistors T3, T4 and T7 of the nth-first and nth-second pixels Pn1 and Pn2 are turned on, and the first mux transistor Tm1, the first, second, fifth, sixth, eighth and ninth transistors T1, T2, T5, T6, T8 and T9 of the nth-first and nth-second pixels Pn1 and Pn2, and the first to ninth transistors T1 to T9 of the (n+1)th-first and (n+1)th-second pixels P(n+1)1 and P(n+1)2 are turned off. The second electrode of the storage capacitor Cst of the nth-first and nth-second pixels Pn1 and Pn2 becomes a high level voltage Vdd, and the first electrode of the storage capacitor Cst of the nth-first and nth-second pixels Pn1 and Pn2 becomes a value (Vdd−Vref+Vdata+Vth) obtained by adding a difference (Vdd-Vref) between the high level voltage Vdd and the reference voltage Vref to the sum (Vdata+Vth) of the data voltage Vdata and the threshold voltage Vth. As a result, a current proportional to a square of a value (Vdd−Vref) obtained by subtracting the threshold voltage Vth from a gate-source voltage (Vgs=(Vg−Vs)= (Vdd−Vref+Vdata+Vth)−Vdd=Vdata−Vref+Vth) flows in the driving transistor Td. the data voltage Vdata and the threshold voltage Vth are stored in the storage capacitor Cst, and the light emitting diode De emits a light of a luminance corresponding to the current of the driving transistor Td.

Although not shown, the light emitting diodes De of the (n+1)th-first and (n+1)th-second pixels P(n+1)1 and P(n+1)2 emit a light from an end timing of the eighth time period TP8.

During the first time period TP1, the gate electrode of the driving transistor Td and the first electrode of the storage capacitor Cst of the nth-first and nth-second pixels Pn1 and Pn2 are initialized. (initialization period of odd row HLo)

During the second and third time periods TP2 and TP3, the sum (Vdd+Vth) of the data voltage Vdata and the threshold voltage Vth is stored in the gate electrode of the driving transistor Td and the first electrode of the storage capacitor Cst of the nth-first pixel Pn1. (sampling period of odd row HLo and odd column VLo) During the fifth and sixth time periods TP5 and TP6, the sum (Vdd+Vth) of the data voltage Vdata and the threshold voltage Vth is stored in the gate electrode of the driving transistor Td and the first electrode of the storage capacitor Cst of the nth-second pixel Pn2. (sampling period of odd row HLo and even column VLe)

Here, during the second time period TP2, the first mux transistor Tm1 is turned on, and the left data line DLL of the odd row HLo and the odd column VLo is charged with the data voltage Vdata. During the third time period TP3, the first mux transistor Tm1 is turned off, and the left data line DLL of the odd row HLo and the odd column VLo is floated such that the data voltage Vdata charged in the left data line DLL is maintained.

During the fifth time period TP5, the second mux transistor Tm2 is turned on, and the right data line DLR of the odd row HLo and the even column VLe is charged with the data voltage Vdata. During the sixth time period TP3, the second mux transistor Tm2 is turned off, and the right data line DLR of the odd row HLo and the even column VLe is floated such that the data voltage Vdata charged in the right data line DLR is maintained.

During the third time period TP3, the second mux transistor Tm2 is turned on, and the right data line DLR of the even row HLe and the odd column VLo is charged with the data voltage Vdata. During the fourth time period TP4, the second mux transistor Tm2 is turned off, and the right data line DLR of the even row HLe and the odd column VLo is floated such that the data voltage Vdata charged in the right data line DLR is maintained.

During the sixth time period TP6, the first mux transistor Tm1 is turned on, and the left data line DLL of the even row HLe and the even column VLe is charged with the data voltage Vdata. During the seventh time period TP7, the first mux transistor Tm1 is turned off, and the left data line DLL of the even row HLe and the even column VLe is floated such that the data voltage Vdata charged in the left data line DLL is maintained.

During the second time period TP2, the gate electrode of the driving transistor Td and the first electrode of the storage capacitor Cst of the (n+1)th-first and (n+1)th-second pixels P(n+1)1 and P(n+1)2 are initialized. (initialization period of even row HLe)

During the third and fourth time periods TP3 and TP4, the sum (Vdd+Vth) of the data voltage Vdata and the threshold voltage Vth is stored in the gate electrode of the driving transistor Td and the first electrode of the storage capacitor Cst of the (n+1)th-first pixel P(n+1)1. (sampling period of even row HLe and odd column VLo) During the sixth and seventh time periods TP6 and TP7, the sum (Vdd+Vth) of the data voltage Vdata and the threshold voltage Vth is stored in the gate electrode of the driving transistor Td and the first electrode of the storage capacitor Cst of the (n+1)th-second pixel P(n+1)2. (sampling period of even row HLe and even column VLe)

After the eighth time period TP8, the light emitting diode De of the nth-first and nth-second pixels Pn1 and Pn2 emits a light. (emission period of odd row HLo) After the end timing of the eighth time period TP8, the light emitting diode De of the (n+1)th-first and (n+1)th-second pixels P(n+1)1 and P(n+1)2 emits a light. (emission period of even row HLe)

The OLED display device according to a first embodiment of the present disclosure is driven such that the sampling period of the odd row HLo and the odd column VLo and the sampling period of the odd row HLo and the even column VLe do not overlap each other and the sampling period of the even row HLe and the odd column VLo and the sampling period of the even row HLe and the even column VLe do not overlap each other.

As a result, while the data voltage Vdata is applied to the next row HL, the number of the floated data lines DL of the present row is reduced, and the variation (ripple) of the high level voltage Vdd due to the change of the data voltage Vdata applied to the next row HL is reduced. Further, the distortion of the floated data voltage Vdata of the present row HL due to the variation of the high level voltage Vdd is reduced, and the deterioration such as a crosstalk is minimized.

Reduction of the variation of the data voltage in the OLED display device 110 will be illustrated with reference to drawings.

Figure 5A:
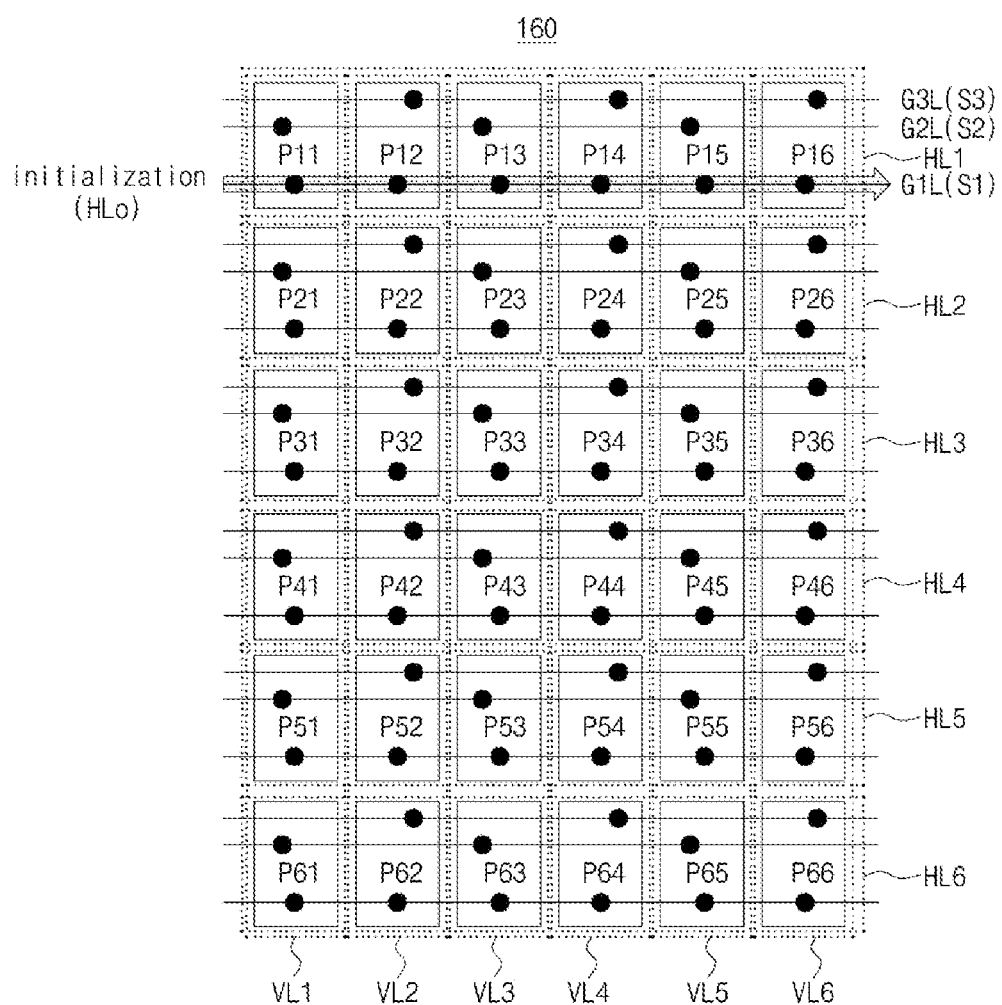
FIGS. 5A to 5C are views showing a connection and an operation of pixels of an organic light emitting diode display device according to a first embodiment of the present disclosure.
Figure 5B:
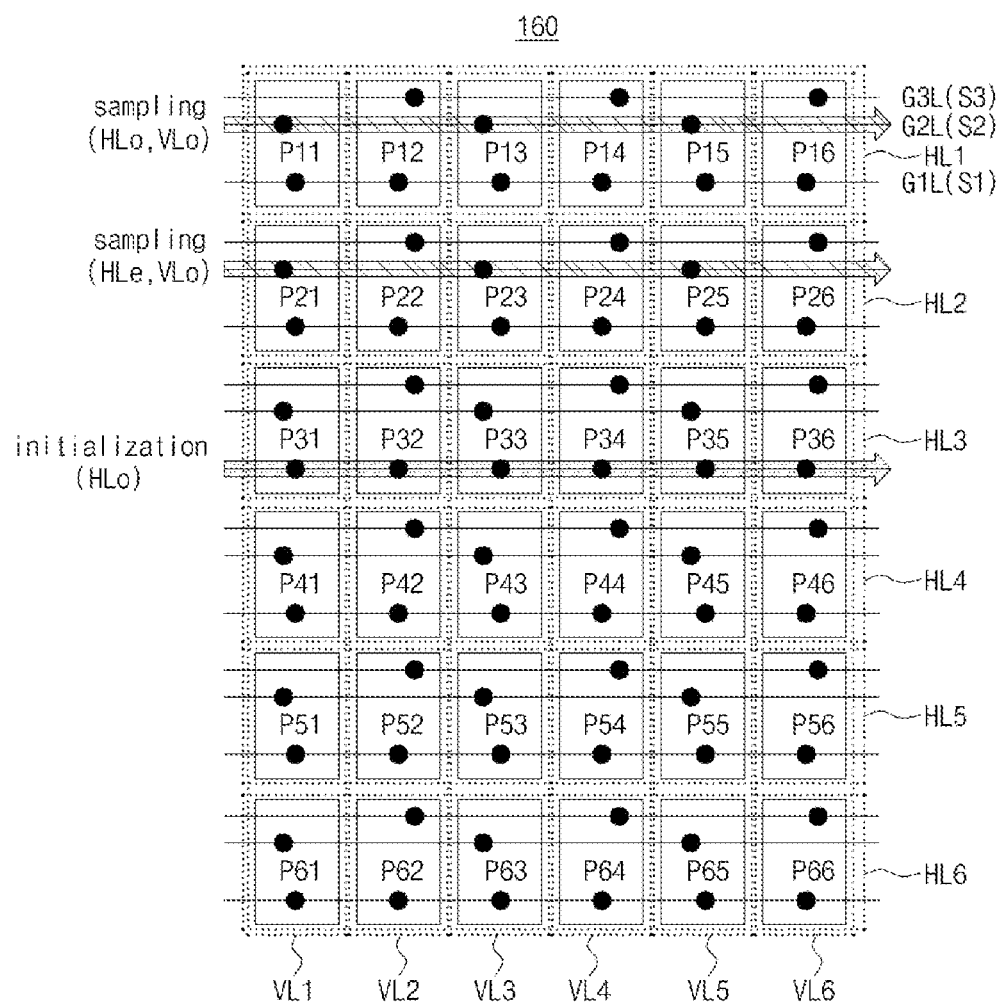
Figure 5C:
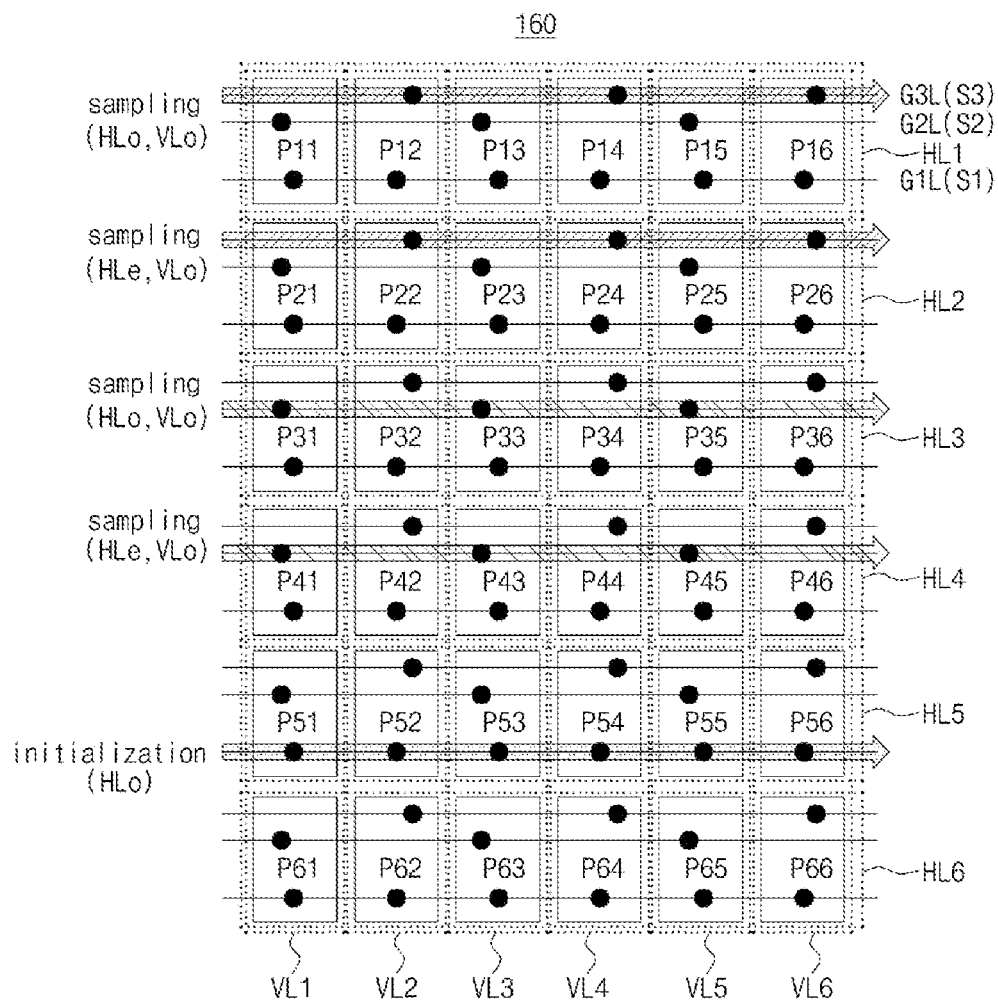
Figure 6A:
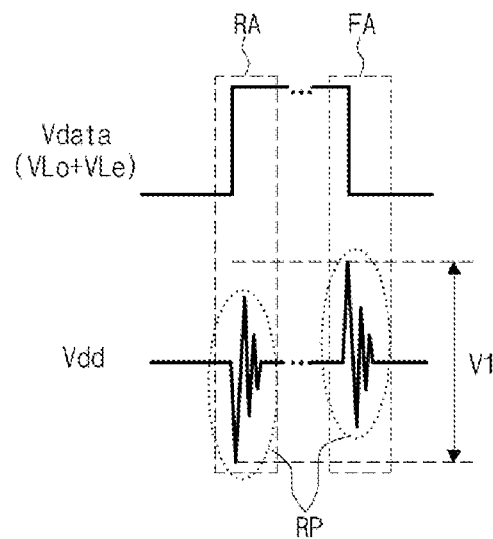
FIGS. 6A and 6B are views showing a variation of a high level voltage of an organic light emitting diode display device according to a comparison example and a first embodiment of the present disclosure, respectively.
Figure 6B:
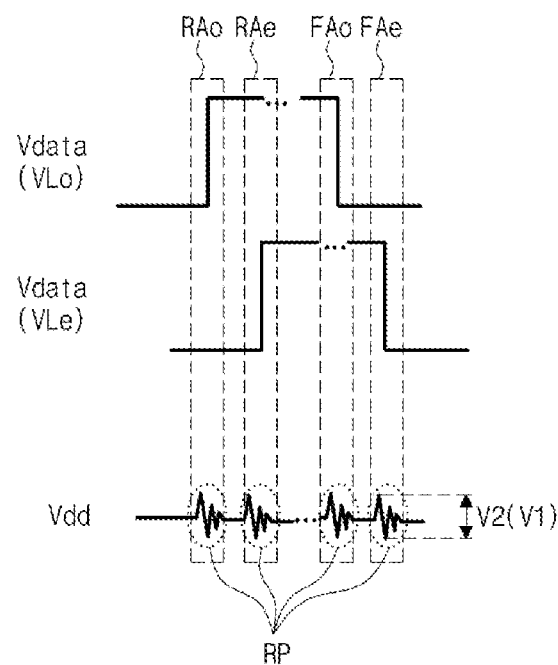

FIGS. 5A to 5C are views showing a connection and an operation of pixels of an organic light emitting diode display device according to a first embodiment of the present disclosure, and FIGS. 6A and 6B are views showing a variation of a high level voltage of an organic light emitting diode display device according to a comparison example and a first embodiment of the present disclosure, respectively.

In FIGS. 5A to 5C, the display panel 160 of the OLED display device 110 according to a first embodiment of the present disclosure includes first-first to sixth-sixth pixels P11 to P66 which are divided into first to sixth rows HL1 to HL6 and first to sixth columns VL1 to VL6.

A gate1 line G1L transmitting a gate1 voltage S1, a gate2 line G2L transmitting a gate2 voltage S2 and a gate3 line G3L transmitting a gate3 voltage S3 are disposed in each of the first to sixth rows HL1 to HL6. The gate1 line G1L contacts each subpixel SP of the pixels P of the first to sixth columns VL1 to VL6 of each of the first to sixth rows HL1 to HL6, the gate2 line G2L contacts each subpixel SP of the pixels P of the first, third and fifth columns (odd columns) VL1, VL3 and VL5 of each of the first to sixth rows HL1 to HL6, and the gate3 line G3L contacts each subpixel SP of the pixels P of the second, fourth and sixth columns (even columns) VL2, VL4 and VL6 of each of the first to sixth rows HL1 to HL6.

In FIG. 5A, an initialization of the first to sixth columns VL1 to VL6 of the first row HL1 is performed.

During the initialization period of the first row HL1 of an odd row, the gate1 voltage S1 is supplied to the first-first to first-sixth pixels P11 to P16 through the gate1 line G1L.

For example, during the first time period TP1, the first-first to first-sixth pixels P11 to P16 of the first row HL1 of an odd row may be initialized.

In FIG. 5B, an initialization of the first to sixth columns VL1 to VL6 of the third row HL3 and an sampling of the first, third and fifth columns VL1, VL3 and VL5 of the second and first rows HL2 and HL1 are simultaneously performed.

During the initialization period of the third row HL3 of an odd row, the gate1 voltage S1 is supplied to the third-first to third-sixth pixels P31 to P36 through the gate1 line G1L.

At the same time, during the sampling period of the first, third and fifth columns VL1, VL3 and VL5 of an odd column of the second row HL2 of an even row and the first row HL1 of an odd row, the gate2 voltage S2 is supplied to the second-first, second-third and second-fifth pixels P21, P23 and P25 and the first-first, first-third and first-fifth pixels P11, P13 and P15 through the gate2 line G2L.

For example, during the third time period TP3, the third-first to third-sixth pixels P31 to P36 of the third row HL3 of an odd row may be initialized, and the second-first, second-third and second-fifth pixels P21, P23 and P25 of the second row HL2 of an even row and the first-first, first-third and first-fifth pixels P11, P13 and P15 of the first row HL1 of an odd row may be sampled.

While the right data line DLR of the second-first, second-third and second-fifth pixels P21, P23 and P25 of the second row HL2 is charged with the data voltage Vdata, the left data line DLL of the first-first, first-third and first-fifth pixels P11, P13 and P15 of the first row HL1 is floated such that the data voltage Vdata charged in the left data line DLL is maintained.

The right data line DLR of the second-first, second-third and second-fifth pixels P21, P23 and P25 of a half of six pixels is charged with the data voltage Vdata instead that the right data line DLR of all of the second-first to second-sixth pixels P21 to P26 of the second row HL2 is charged with the data voltage Vdata. As a result, the variation (ripple) of the high level voltage Vdd of a first power line PL1 (of FIGS. 8A to 8D) due to a coupling of the right data line DLR of the second row HL2 and the first power line PL1 is reduced, and the distortion of the floated data voltage Vdata of the left data line DLL of the first row HL1 due to a coupling of the first power line PL1 and the left data line DLL of the first row HL1 is reduced.

In FIG. 5C, an initialization of the first to sixth columns VL1 to VL6 of the fifth row HL5, an sampling of the first, third and fifth columns VL1, VL3 and VL5 of the fourth and third rows HL4 and HL3 and an sampling of the second, fourth and sixth columns VL2, VL4 and VL6 of the second and first rows HL2 and HL1 are simultaneously performed.

During the initialization period of the fifth row HL5 of an odd row, the gate1 voltage S1 is supplied to the fifth-first to fifth-sixth pixels P51 to P56 through the gate1 line G1L.

At the same time, during the sampling period of the first, third and fifth columns VL1, VL3 and VL5 of an odd column of the fourth row HL4 of an even row and the third row HL3 of an odd row, the gate2 voltage S2 is supplied to the fourth-first, fourth-third and fourth-fifth pixels P41, P43 and P45 and the third-first, third-third and third-fifth pixels P31, P33 and P35 through the gate2 line G2L.

At the same time, during the sampling period of the second, fourth and sixth columns VL2, VL4 and VL6 of an even column of the second row HL2 of an even row and the first row HL1 of an odd row, the gate3 voltage S3 is supplied to the second-second, second-fourth and second-sixth pixels P22, P24 and P26 and the first-second, first-fourth and first-sixth pixels P12, P14 and P16 through the gate3 line G3L.

For example, during the fifth time period TP5, the fifth-first to fifth-sixth pixels P51 to P56 of the fifth row HL5 of an odd row may be initialized, the fourth-first, fourth-third and fourth-fifth pixels P41, P43 and P45 of the fourth row HL4 of an even row and the third-first, third-third and third-fifth pixels P31, P33 and P35 of the third row HL3 of an odd row may be sampled, and the second-second, second-fourth and second-sixth pixels P22, P24 and P26 of the second row HL2 of an even row and the first-second, first-fourth and first-sixth pixels P12, P14 and P16 of the first row HL1 of an odd row may be sampled.

While the right data line DLR of the fourth-first, fourth-third and fourth-fifth pixels P41, P43 and P45 of the fourth row HL4 is charged with the data voltage Vdata, the left data line DLL of the third-first, third-third and third-fifth pixels P31, P33 and P35 of the third row HL3 is floated such that the data voltage Vdata charged in the left data line DLL is maintained.

The right data line DLR of the fourth-first, fourth-third and fourth-fifth pixels P41, P43 and P45 of a half of six pixels is charged with the data voltage Vdata instead that the right data line DLR of all of the fourth-first to fourth-sixth pixels P41 to P46 of the fourth row HL4 is charged with the data voltage Vdata. As a result, the variation (ripple) of the high level voltage Vdd of a first power line PL1 (of FIGS. 8A to 8D) due to a coupling of the right data line DLR of the fourth row HL4 and the first power line PL1 is reduced, and the distortion of the floated data voltage Vdata of the left data line DLL of the third row HL3 due to a coupling of the first power line PL1 and the left data line DLL of the third row HL3 is reduced.

While the right data line DLR of the second-second, second-fourth and second-sixth pixels P22, P24 and P26 of the second row HL2 is charged with the data voltage Vdata, the left data line DLL of the first-second, first-fourth and first-sixth pixels P12, P14 and P16 of the first row HL1 is floated such that the data voltage Vdata charged in the left data line DLL is maintained.

The right data line DLR of the second-second, second-fourth and second-sixth pixels P22, P24 and P26 of a half of six pixels is charged with the data voltage Vdata instead that the right data line DLR of all of the second-first to second-sixth pixels P21 to P26 of the second row HL2 is charged with the data voltage Vdata. As a result, the variation (ripple) of the high level voltage Vdd of a first power line PL1 (of FIGS. 8A to 8D) due to a coupling of the right data line DLR of the second row HL2 and the first power line PL1 is reduced, and the distortion of the floated data voltage Vdata of the left data line DLL of the first row HL1 due to a coupling of the first power line PL1 and the left data line DLL of the first row HL1 is reduced.

In FIG. 6A, sampling periods of an organic light emitting diode display device according to a comparison example are not divided by a column VL. When the data voltage Vdata supplied to the odd and even columns VLo and VLe of the next row HL transitions from a low level to a high level in a rising region RA and transitions from a high level to a low level in a falling region FA in the sampling period, the variation RP of a first voltage V1 occurs in the high level voltage Vdd of the first power line PL1 due to a coupling of the left and right data lines DLL and DLR of the next row HL and the first power line PL1.

In FIG. 6B, sampling periods of the OLED display device 110 according to a first embodiment of the present disclosure are divided by a column VL. When the data voltage Vdata supplied to the odd column VLo of the next row HL transitions from a low level to a high level in an odd rising region RAo and transitions from a high level to a low level in an odd falling region FAo in the sampling period and the data voltage Vdata supplied to the even column VLe of the next row HL transitions from a low level to a high level in an even rising region RAe and transitions from a high level to a low level in an even falling region FAe, the variation RP occurs in the high level voltage Vdd of the first power line PL1 due to a coupling of the left and right data lines DLL and DLR of the next row HL and the first power line PL1.

Since the columns VL relating to the coupling are divided into the odd and even columns and the number of the columns VL relating to the coupling is reduced to a half, the variation RP of the high level voltage Vdd of the OLED display device 110 according to a first embodiment of the present disclosure has a second voltage V2 smaller than the first voltage V1 of the variation RP of the high level voltage Vdd of the comparison example. (V2<V1)

As a result, the distortion of the data voltage Vdata of the present row HL according to the second voltage V2 of the variation RP of the high level voltage Vdd is reduced.

In the OLED display device 110 according to a first embodiment of the present disclosure, since the gate2 line G2L and the gate3 line G3L are connected to the odd column VLo and the even column VLe, respectively, and the odd column VLo and the even column VLe are driven with different sampling periods according to the gate2 voltage S2 and the gate3 voltage S3, respectively, the variation (ripple) of the high level voltage Vdd is reduced and the distortion of the data voltage Vdata is minimized. As a result, deterioration such as a crosstalk is reduced.

The columns of the pixels may be divided into an odd pair and an even pair in another embodiment.

Figure 7:
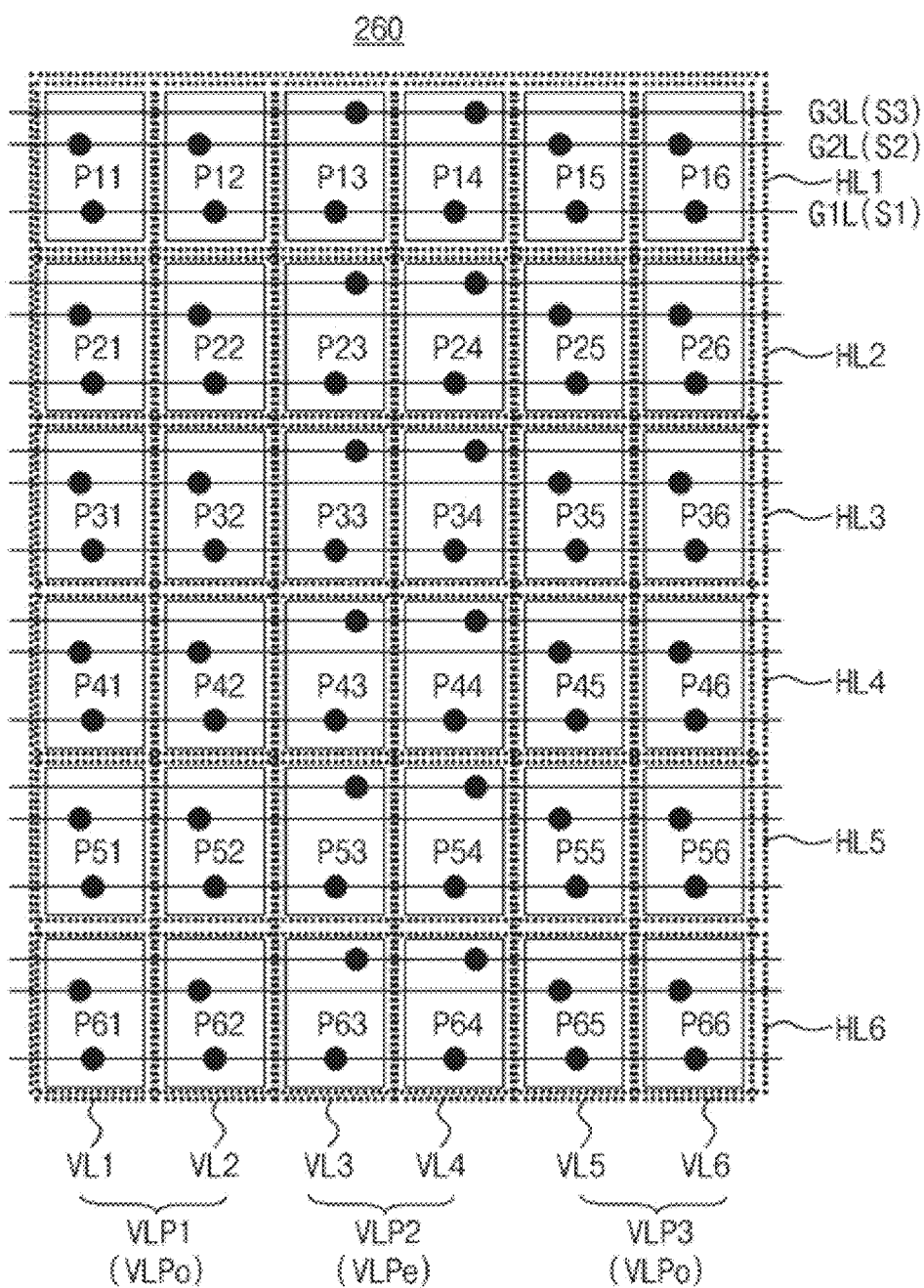
FIG. 7 is a view showing a connection of pixels of an organic light emitting diode display device according to a second embodiment of the present disclosure.
Figure 8A:
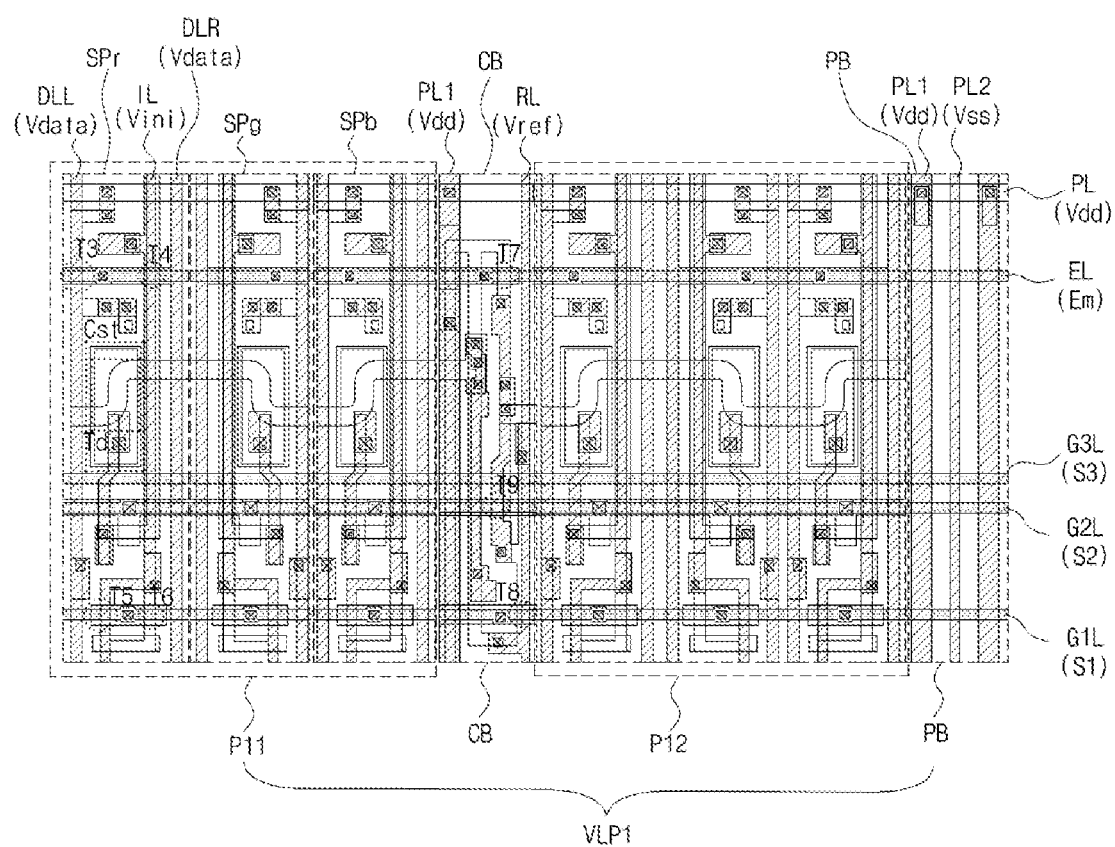
FIGS. 8A to 8D are plan views showing first-first to second-fourth pixels of an organic light emitting diode display device according to a second embodiment of the present disclosure.
Figure 8B:
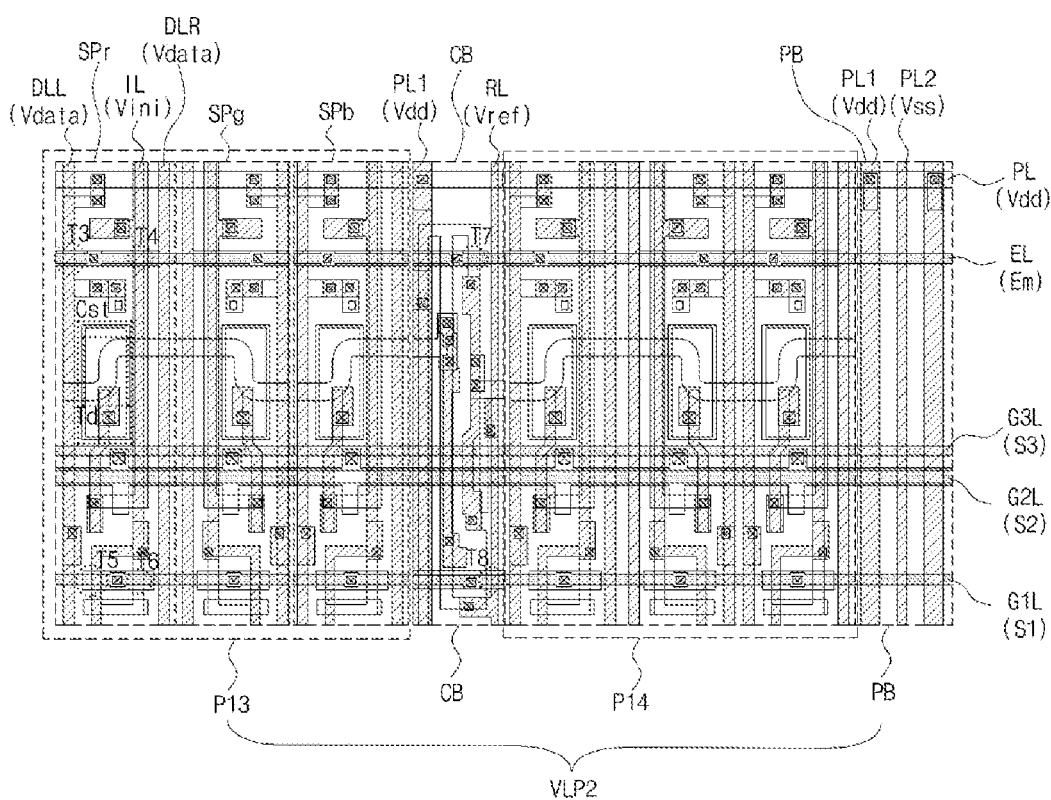
Figure 8C:
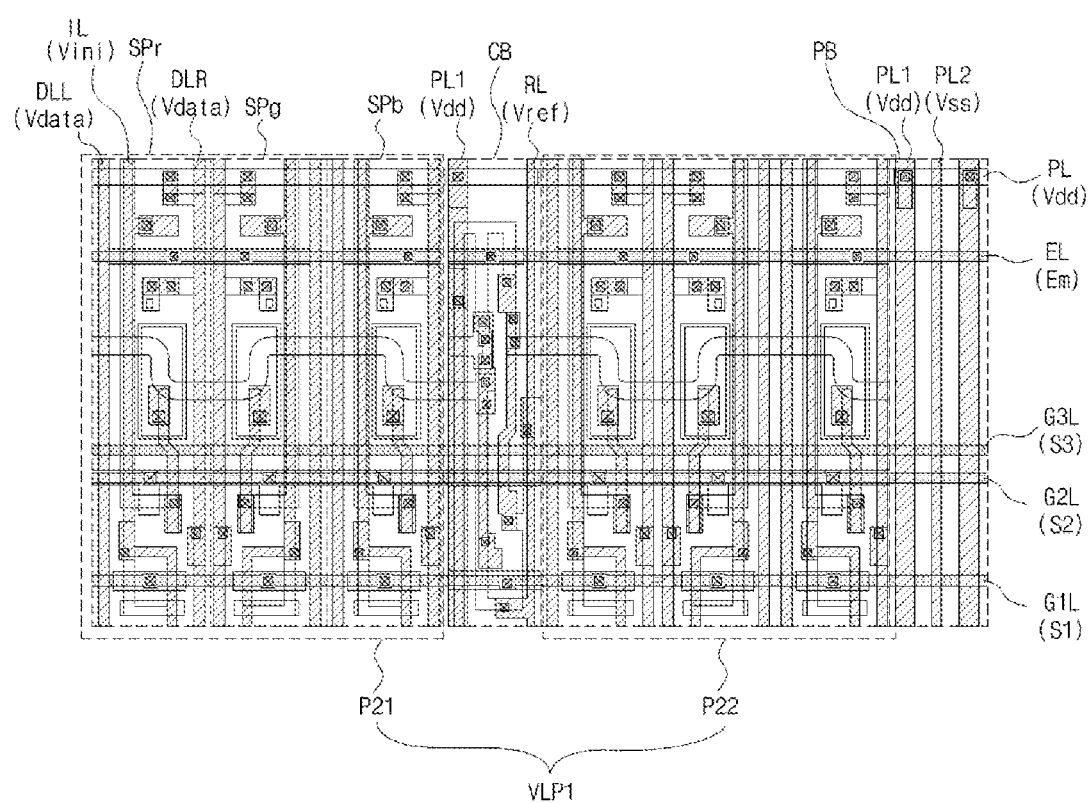
Figure 8D:
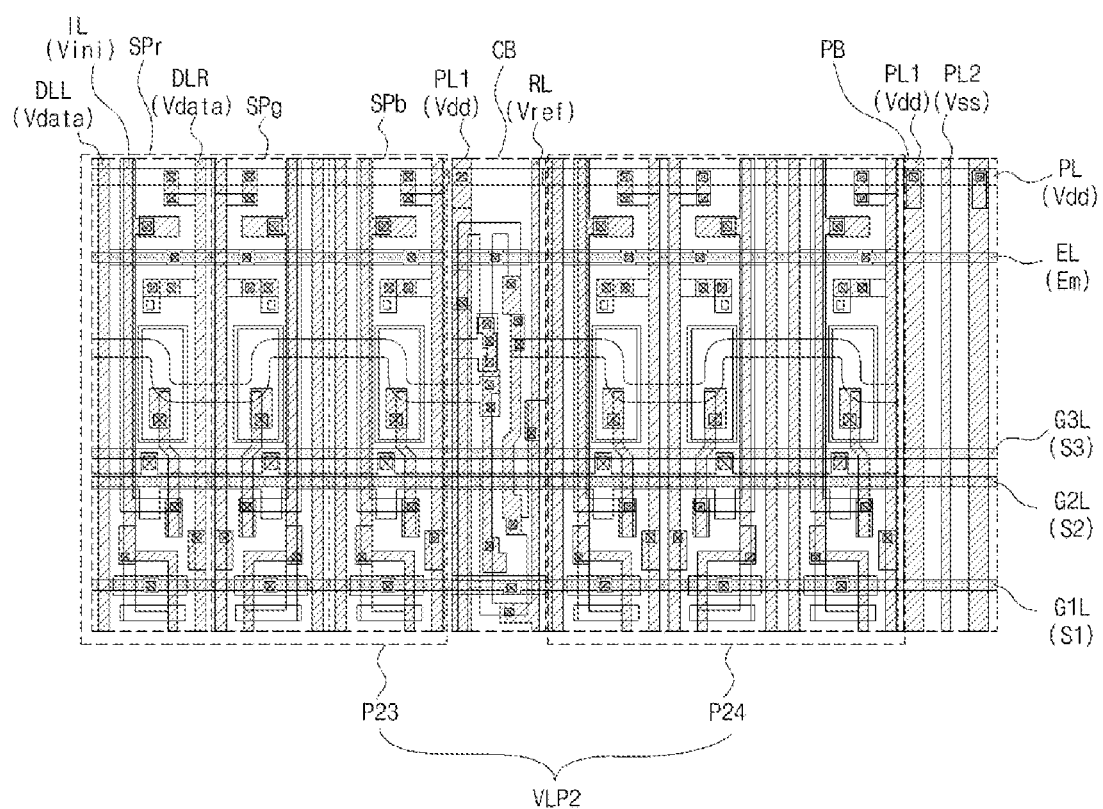
Figure 9:
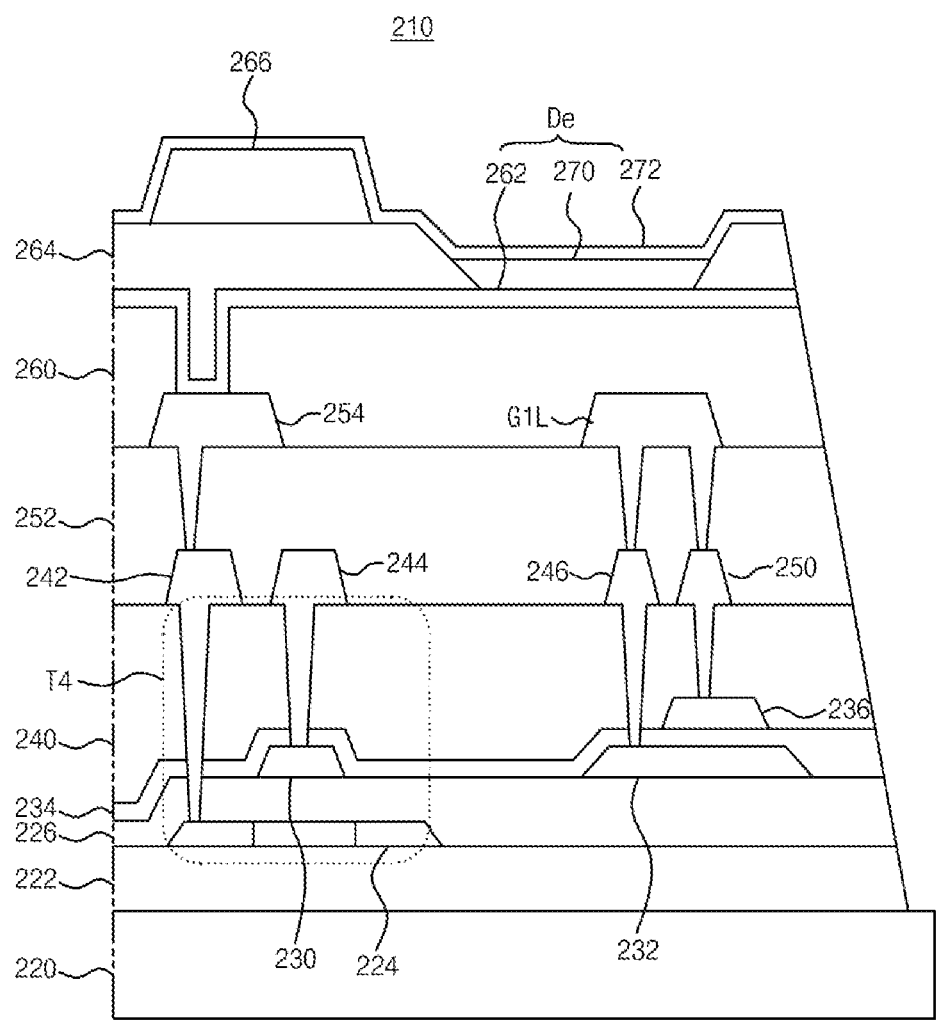
FIG. 9 is a cross-sectional view showing a transistor and a gate line of an organic light emitting diode display device according to a second embodiment of the present disclosure.

FIG. 7 is a view showing a connection of pixels of an organic light emitting diode display device according to a second embodiment of the present disclosure, FIGS. 8A to 8D are plan views showing first-first to second-fourth pixels of an organic light emitting diode display device according to a second embodiment of the present disclosure, and FIG. 9 is a cross-sectional view showing a transistor and a gate line of an organic light emitting diode display device according to a second embodiment of the present disclosure. Illustration on a part of the second embodiment the same as a part of the first embodiment will be omitted.

In FIG. 7, an organic light emitting diode (OLED) display device 210 (of FIGS. 8A to 8D) includes first-first to sixth-sixth pixels P11 to P66 which are divided into first to sixth rows HL1 to HL6 and first to sixth columns VL1 to VL6, and the first to sixth columns VL1 to VL6 may be divided into first to third column pairs VLP1 to VLP3.

A gate1 line G1L transmitting a gate1 voltage S1, a gate2 line G2L transmitting a gate2 voltage S2 and a gate3 line G3L transmitting a gate3 voltage S3 are disposed in each of the first to sixth rows HL1 to HL6.

The gate1 line G1L contacts each subpixel SP of the pixels P of the first to sixth columns VL1 to VL6 of each of the first to sixth rows HL1 to HL6.

The gate2 line G2L contacts each subpixel SP of the pixels P of the first, second, fifth and sixth columns VL1, VL2, VL5 and VL6 of the first and third column pairs VLP1 and VLP3 of an odd pair of each of the first to sixth rows HL1 to HL6, and the gate3 line G3L contacts each subpixel SP of the pixels P of the third and fourth columns VL3 and VL4 of the second column pair VLP2 of an even pair of each of the first to sixth rows HL1 to HL6.

In FIGS. 8A to 8D, the OLED display device 210 according to a second embodiment of the present disclosure includes the first-first to second-fourth pixels P11 to P24 and a common block CB and a power block PB disposed between the adjacent pixels, and each of the first-first to second-fourth pixels P11 to P24 includes red, green and blue subpixels SPr, SPg and SPb.

The OLED display device 210 further includes a plurality of gate1 lines G1L transmitting a gate1 voltage S1, a plurality of gate2 lines G2L transmitting a gate2 voltage S2, a plurality of gate3 lines G3L transmitting a gate3 voltage S3, a plurality of emission lines EL transmitting an emission voltage Em, a plurality of initial lines IL transmitting an initial voltage Vini, a plurality of reference lines RL transmitting a reference voltage Vref, a plurality of first power lines PL1 transmitting a high level voltage Vdd, a plurality of second power lines PL2 transmitting a low level voltage Vss and a plurality of left and right data lines DLL and DLR transmitting a data voltage Vdata.

The gate1 line G1L, the gate2 line G2L, the gate3 line G3L and the emission line EL are disposed parallel to a horizontal direction of a long side of the OLED display device 210, and the initial line IL, the reference line RL, the second power line PL2 and the left and right data lines DLL and DLR are disposed parallel to a vertical direction of a short side of the OLED display device 210. The first power line PL1 is disposed parallel to the horizontal direction and the vertical direction.

The gate1 line G1L, the first power line PL1 of the horizontal direction, the left data line DLL and the initial line IL cross each other to define the red, green and blue subpixels SPr, SPg and SPb.

For example, in each of the red, green and blue subpixels SPr, SPg and SPb, the first power line PL1, the emission line EL, the gate3 line G3L, the gate2 line G2L and the gate1 line G1L may be sequentially disposed along the vertical direction, and the left data line DLL, the right data line DLR and the initial line IL may be sequentially disposed along the horizontal direction.

The first power line PL1 of the vertical direction and the reference line RL are disposed in the common block CB, and the first power line PL1 of the vertical direction and the second power line PL2 are disposed in the power block PB.

The first power line PL1, the reference line RL and seventh to ninth transistors T7 to T9 are disposed in the common block CB, and the first and second power lines PL1 and PL2 are disposed in the power block PB such that the red, green and blue subpixels SPr, SPg and SPb share the common block CB and the power block PB. As a result, a line width of the first and second power lines PL1 and PL2 transmitting the high level voltage Vdd and the low level voltage Vss may be maximized, and a voltage drop of the high level voltage Vdd and a voltage rise of the low level voltage Vss due to a resistance and a current of the lines may be minimized.

Each of the red, green and blue subpixels SPr, SPg and SPb includes first to sixth transistors T1 to T6, a storage capacitor Cst and a light emitting diode D, and the common block CB includes the seventh to ninth transistors T7 to T9.

Each of the red, green and blue subpixels SPr, SPg and SPb constituting one pixel P includes the first to sixth transistors T1 to T6, and the two adjacent pixels P include the seventh to ninth transistors T7 to T9.

For example, each of the red, green and blue subpixels SPr, SPg and SPb of the first-first and first-second pixels P11 and P12 may include the first to sixth transistors T1 to T6, and the common block CB between the first-first and first-second pixels P11 and P12 may include the seventh to ninth transistors T7 to T9. The seventh to ninth transistors T7 to T9 of the common block CB may be commonly connected to the first to sixth transistors T1 to T6 of each of the red, green and blue subpixels SPr, SPg and SPb of the first-first and first-second pixels P11 and P12.

Similarly, each of the red, green and blue subpixels SPr, SPg and SPb of the first-third, first-fourth, second-first, second-second, second-third and second-fourth pixels P13, P14, P21, P22, P23 and P24 may include the first to sixth transistors T1 to T6, and each of the common blocks CB between the first-third and first-fourth pixels P13 and P14, between the second-first and second-second pixels P21 and P22 and between the second-third and second-fourth pixels P23 and P24 may include the seventh to ninth transistors T7 to T9. The seventh to ninth transistors T7 to T9 of the common block CB may be commonly connected to the first to sixth transistors T1 to T6 of each of the red, green and blue subpixels SPr, SPg and SPb of the first-third, first-fourth, second-first, second-second, second-third and second-fourth pixels P13, P14, P21, P22, P23 and P24.

The gate1 line G1L contacts the first-first to second-fourth pixels P11 to P24, the gate2 line G2L contacts the first-first, first-second, second-first and second-second pixels P11, P12, P21 and P22 of the first column pair VLP1 of an odd pair, and the gate3 line G3L contacts the first-third, first-fourth, second-third and second-fourth pixels P13, P14, P23 and P24 of the second column pair VLP2 of an even pair.

For example, the gate1 line G1L may be connected to a gate electrode of the fifth and sixth transistors T5 and T6 of each of the red, green and blue subpixels SPr, SPg and SPb of the first-first to second-fourth pixels P11 to P24 and a gate electrode of the eighth transistor T8 of the common block CB.

The gate2 line G2L may be connected to a gate electrode of the first and second transistors T1 and T2 of each of the red, green and blue subpixels SPr, SPg and SPb of the first-first, first-second, second-first and second-second pixels P11, P12, P21 and P22 and a gate electrode of the ninth transistor T9 of the common block CB between the first-first and first-second pixels P11 and P12 and between the second-first and second-second pixels P21 and P22.

The gate3 line G3L may be connected to a gate electrode of the first and second transistors T1 and T2 of each of the red, green and blue subpixels SPr, SPg and SPb of the first-third, first-fourth, second-third and second-fourth pixels P13, P14, P23 and P24 and a gate electrode of the ninth transistor T9 of the common block CB between the first-third and first-fourth pixels P13 and P14 and between the second-third and second-fourth pixels P23 and P24.

The pixel P of the odd column pair VLPo performs the sampling according to the gate2 voltage S2, and the pixel P of the even column pair VLPe performs the sampling according to the gate3 voltage S3. As a result, the number of the left and right data lines DLL and DLR contributing to the coupling is reduced, and the variation (ripple) of the high level voltage Vdd and the distortion of the data voltage Vdata are minimized.

In FIG. 9, a buffer layer 222 is disposed on the entire substrate 220, and a semiconductor layer 224 is disposed in an area corresponding to the first to ninth transistors T1 to T9 on the buffer layer 222.

The substrate 220 may be formed of a glass or polyimide (PI), and the buffer layer 222 may have a double layer of an inorganic insulating material such as silicon nitride (SiNx) or silicon oxide ($SiO_2$)

The buffer layer 222 may block moisture from a lower portion.

The semiconductor layer 224 may be formed of a semiconductor material such as silicon or an oxide semiconductor material. When the semiconductor layer 224 includes polycrystalline silicon, the semiconductor layer 224 may have an active region at a center and a source-drain region at both sides of the active region.

A gate insulating layer 226 is disposed on the entire semiconductor layer 224, and a gate electrode 230 and a first gate pattern 232 are disposed on the gate insulating layer 226.

Although not shown, a first capacitor electrode connected to a gate electrode of a driving transistor Td may be disposed in an area corresponding to the storage capacitor Cst on the gate insulating layer 226.

The gate insulating layer 226 may be formed of an inorganic insulating material such as silicon oxide ($SiO_2$), and the gate electrode 230, the first gate pattern 232 and the first capacitor electrode may be formed of a metallic material such as molybdenum (Mo).

The gate electrode 230 may be disposed in an area corresponding to the first to ninth transistors T1 to T9, and the first gate pattern 232 may be disposed in an area corresponding to the gate1 line G1L, the gate2 line G2L and the gate3 line G3L.

The gate electrode 230, the first gate pattern 232 and the first capacitor electrode may have the same layer and the same material as each other.

A first interlayer insulating layer 234 is disposed on the entire gate electrode 230, and a second gate pattern 236 is disposed in an area corresponding to the first gate pattern 232 on the first interlayer insulating layer 234.

Although not shown, a second capacitor electrode connected to a drain electrode of the seventh transistor T7 may be disposed in an area corresponding to the storage capacitor Cst on the first interlayer insulating layer 234.

The first interlayer insulating layer 234 may be formed of an inorganic insulating material such as silicon nitride (SiNx), and the second gate pattern 236 and the second capacitor electrode may be formed of a metallic material such as molybdenum (Mo).

The first capacitor electrode, the first interlayer insulating layer 234 and the second capacitor electrode constitute the storage capacitor Cst.

A second interlayer insulating layer 240 is disposed on the entire second gate pattern 2236 and the second capacitor electrode. A source electrode, a drain electrode 242 and a first connecting electrode 244 are disposed in an area corresponding to the first to ninth transistors T1 to T9 on the second interlayer insulating layer 240, and second and third connecting electrodes 246 and 250 are disposed in an area corresponding to the second gate pattern 236 on the second interlayer insulating layer 240.

The second interlayer insulating layer 240 may have a double layer of an inorganic insulating material such as silicon nitride (SiNx) or silicon oxide ($SiO_2$), and the source electrode, the drain electrode 242 and the first to third connecting electrodes 244, 246 and 250 may have a triple layer of a metallic material such as titanium (Ti) and aluminum (Al).

The source electrode and the drain electrode 242 are connected to both sides of the semiconductor layer 224 through contact holes of the gate insulating layer 226, the first interlayer insulating layer 234 and the second interlayer insulating layer 240. The semiconductor layer 224, the gate electrode 230, the source electrode and the drain electrode 242 constitute the first to ninth transistors T1 to T9.

A first planarizing layer 252 is disposed on the entire source electrode, the drain electrode 242 and the first to third connecting electrodes 244, 246 and 250. An auxiliary electrode 254 is disposed in an area corresponding to a light emitting diode De on the first planarizing layer 252, and the gate1 line G1L, the gate2 line G2L and the gate3 line G3L are disposed in an area corresponding to the second gate pattern 236 on the first planarizing layer 252.

The first planarizing layer 252 may be formed of an organic insulating material such as photoacryl, and the auxiliary electrode 254, the gate1 line G1L, the gate2 line G2L and the gate3 line G3L may have a triple layer of a metallic material such as titanium (Ti) and aluminum (Al).

The auxiliary electrode 254 is connected to the drain electrode 242 of the fourth transistor T4 through a contact hole of the first planarizing layer 252.

The auxiliary electrode 254, the gate1 line G1L, the gate2 line G2L and the gate3 line G3L may be formed of the same layer and the same material as each other.

A second planarizing layer 260 is disposed on the entire auxiliary electrode 254, the gate1 line G1L, the gate2 line G2L and the gate3 line G3L, and an anode 262 is disposed in an area corresponding to the light emitting diode De on the second planarizing layer 260.

The second planarizing layer 260 may be formed of an organic insulating material such as photoacryl, and the anode 262 may have a triple layer of a transparent conductive material such as indium tin oxide (ITO) and a metallic material such as silver palladium copper (APC) alloy.

The anode 262 is connected to the auxiliary electrode 254 through a contact hole of the second planarizing layer 260.

A bank layer 264 is disposed on an edge portion of the anode 262, and an emitting layer 270 is disposed on the anode 262 exposed through an opening of the bank layer 264.

The bank layer 264 may be formed of an organic insulating material such as polyimide (PI), and the emitting layer 270 may emit red, green and blue colored lights in the red, green and blue subpixels SPr, SPg and SPb, respectively.

A spacer 266 is disposed on the bank layer 270, and a cathode 272 is disposed on the entire spacer 266.

The spacer 266 may be formed of an organic insulating material such as polyimide (PI), and the low level voltage Vss may be applied to the cathode 272.

The anode 262, the emitting layer 270 and the cathode 272 constitute the light emitting diode De.

The OLED display device 110 according to a first embodiment of the present disclosure may have the same structure as the OLED display device 210 according to a second embodiment of the present disclosure.

In the OLED display device 210 according to a second embodiment of the present disclosure, the gate2 line G2L and the gate3 line G3L are connected to the odd column pair VLPo and the even column pair VLPe, respectively, and the odd column pair VLPo and the even column pair VLPe are driven with the different sampling periods according to the gate2 voltage S2 and the gate3 voltage S3, respectively. As a result, the variation (ripple) of the high level voltage Vdd is reduced and the distortion of the data voltage Vdata is minimized. Further, deterioration such as a crosstalk is reduced.

One common block CB is disposed in each of the odd column pair VLPo and the even column pair VLPe, and the odd column pair VLPo or the even column pair VLPe connected to the one common block CB is driven with the sampling period according to the gate2 voltage S2 and the gate3 voltage S3. As a result, operation of the odd column pair VLPo or the even column pair VLPe connected to the one common block CB is stabilized.

Consequently, in the OLED display device according to an embodiment of the present disclosure, since the plurality of pixel columns are divided into the odd and even groups and the pixel columns of the odd and even groups have the different sampling periods, the number of the columns of the pixel corresponding to the floated data line is reduced. As a result, the distortion of the data voltage due to the variation (ripple) of the high level voltage is reduced and deterioration such as a crosstalk is reduced.

In the OLED display device according to an embodiment of the present disclosure, a single common block is disposed in two pixels, and the pixel columns corresponding to the common block have the same sampling period. Further, the plurality of pixel columns are divided into the odd pair and even pair groups, and the pixel columns of the odd pair and even pair groups have the different sampling periods. As a result, the operation of the pixel columns corresponding to the common block is stabilized. In addition, the number of the pixel columns corresponding to the floated data line is reduced, the distortion of the data voltage due to the variation (ripple) of the high level voltage is reduced, and deterioration such as a crosstalk is reduced.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. An organic light emitting diode display device, comprising:
   a plurality of pixels arranged in a matrix of a plurality of rows and a plurality of columns, each row from the plurality of rows of pixels comprising:

a gate1 line supplying a gate1 voltage to each of the plurality of pixels in the row of pixels;

a gate2 line supplying a gate2 voltage to a first subset of the plurality of pixels in the row of pixels without supplying the gate2 voltage to a remaining second subset of the plurality of pixels in the row of pixels;

a gate3 line supplying a gate3 voltage to the remaining second subset of the plurality of pixels in the row of pixels without supplying the gate3 voltage to the first subset of the plurality of pixels in the row of pixels; and a plurality of left data lines and a plurality of right data lines at both sides, respectively, of the plurality of pixels of a plurality of columns of pixels.

2. The display device of claim 1, wherein the gate2 line contacts the plurality of pixels of odd columns of the plurality of columns of pixels, and wherein the gate3 line contacts the plurality of pixels of even columns of the plurality of columns of pixels.

3. The display device of claim 2, wherein the odd columns include first-first and first-third pixels, and the even columns include first-second and first-fourth pixels, wherein each of the first-first, first-second, first-third and first-fourth pixels includes red, green and blue subpixels and a common block, wherein each of the red, green and blue subpixels includes first to sixth transistors, and wherein the common block includes seventh to ninth transistors connected to the red, green and blue subpixels.

4. The display device of claim 1, wherein the gate2 line contacts the plurality of pixels of odd column pairs of the plurality of columns of pixels, and wherein the gate3 lines contacts the plurality of pixels of even column pairs of the plurality of columns of pixels.

5. The display device of claim 4, wherein the odd column pairs include first-first and first-second pixels, and the even column pairs include first-third and first-fourth pixels, wherein each of the first-first, first-second, first-third and first-fourth pixels includes red, green and blue subpixels, wherein a common block is disposed between the first-first and first-second pixels and between the first-third and first-fourth pixels, wherein each of the red, green and blue subpixels includes first to sixth transistors, and wherein the common block includes seventh to ninth transistors connected to the red, green and blue subpixels.

6. The display device of claim 1, wherein the plurality of left data lines contact the plurality of pixels of an odd row of the plurality of rows of pixels, and wherein the plurality of right data lines contacts the plurality of pixels of an even row of the plurality of rows of pixels.

7. The display device of claim 6, further comprising a mux unit connected to the plurality of left data lines and the plurality of right data lines, wherein the mux unit includes a first mux transistor connected to the plurality of left data lines and a second mux transistor connected to the plurality of right data lines.

8. The display device of claim 1, wherein each of the plurality of pixels includes a driving transistor, a first transistor connected to the driving transistor and a storage capacitor connected to the driving transistor and the first transistor, wherein the gate2 line is connected to the first transistor of the first subset, and wherein the gate3 line is connected to the first transistor of the remaining second subset.

9. The display device of claim 1, wherein each of the gate2 voltage and the gate3 voltage has a peak section, and the peak sections of the gate2 voltage and the gate3 voltage are separated from each other without overlapping.

10. A method of driving an organic light emitting diode display device, the method comprising:

initializing each of a plurality of pixels of a plurality of rows of pixels according to a gate1 voltage;

sampling, for each of the plurality of rows of pixels, a first subset of the plurality of pixels in the row of pixels according to a gate2 voltage without sampling a remaining second subset of the plurality of pixels in the row of pixels according to the gate2 voltage;

sampling, for each of the plurality of rows of pixels, the remaining second subset of the plurality of pixels in the row of pixels according to a gate3 voltage without sampling the first subset of the plurality of pixels in the row of pixels according to the gate3 voltage; and emitting light from the plurality of pixels according to an emission voltage.

11. The method of claim 10, wherein the gate2 voltage is supplied to the plurality of pixels of odd columns of a plurality of columns of pixels, and wherein the gate3 voltage is supplied to the plurality of pixels of even columns of the plurality of columns of pixels.

12. The method of claim 10, wherein the gate2 voltage is supplied to the plurality of pixels of odd column pairs of a plurality of columns of pixels, and wherein the gate3 voltage is supplied to the plurality of pixels of even column pairs of the plurality of columns of pixels.

* * * * *